US006143471A

United States Patent [19]

Takata et al.

[11] Patent Number: 6,143,471

[45] Date of Patent: Nov. 7, 2000

[54] POSITIVE TYPE PHOTOSENSITIVE COMPOSITION

[75] Inventors: Masakazu Takata; Naoki Hisamatsu, both of Tokyo, Japan

[73] Assignee: Mitsubishi Paper Mills Limited, Tokyo, Japan

[21] Appl. No.: 09/264,905

[22] Filed: Mar. 9, 1999

[30] Foreign Application Priority Data

| | | | |
|---|---|---|---|
| Mar. 10, 1998 | [JP] | Japan | 10-057770 |
| Sep. 18, 1998 | [JP] | Japan | 10-264980 |
| Nov. 27, 1998 | [JP] | Japan | 10-336875 |
| Feb. 9, 1999 | [JP] | Japan | 11-031819 |
| Mar. 2, 1999 | [JP] | Japan | 11-053446 |

[51] Int. Cl.[7] .............................. G03C 1/73; G03F 7/035

[52] U.S. Cl. .................................... 430/281.1; 430/284.1; 430/155; 430/944

[58] Field of Search ............................. 430/270.1, 281.1, 430/284.1, 905, 944, 155

[56] References Cited

U.S. PATENT DOCUMENTS

| | | | |
|---|---|---|---|
| 3,901,710 | 8/1975 | Ranz et al. | 430/292 |
| 4,181,531 | 1/1980 | Pilz | 430/270.1 |
| 4,271,260 | 6/1981 | Abele et al. . | |
| 5,846,690 | 12/1998 | Padmanaban et al. | 430/270.1 |
| 5,858,626 | 1/1999 | Sheriff et al. | 430/326 |

FOREIGN PATENT DOCUMENTS

| | | |
|---|---|---|
| 0 823 327 | 2/1998 | European Pat. Off. . |
| 10268512 | 10/1998 | Japan . |
| 97/39894 | 10/1997 | WIPO . |

OTHER PUBLICATIONS

Huang et al., "Thermal Imaging: Application in Offset Printing Plate Making," IS & Ts NIP 14: 1998 International Conference on Digital Printing Technologies, p. 190–193.

*Primary Examiner*—Janet Baxter
*Attorney, Agent, or Firm*—Pillsbury Madison & Sutro LLP

[57] ABSTRACT

There is disclosed a positive type photosensitive composition which comprises a support, and a recording layer provided thereon containing at least a polymer which is soluble in an alkaline developer, a near infrared rays-absorbing dye, and a compound which lowers solubility of the polymer in the alkaline developer, wherein a contact angle of the recording layer is 70° or higher and the contact angle is lowered by irradiating a near infrared rays laser.

3 Claims, No Drawings

POSITIVE TYPE PHOTOSENSITIVE COMPOSITION

BACKGROUND OF THE INVENTION

1. Field of the Invention

This invention relates to a photosensitive composition having high sensitivity at a near infrared ray region, particularly to a positive type photosensitive composition which is possible to directly make a plate by using a near infrared ray laser with digital signals such as a computer and the like.

2. Background art

A positive type printing plate generally has a form in which a photosensitive coating layer is provided on a support by coating. It is a printing plate of a type that when the photosensitive coating film is exposed to a suitable radiation, a solubility to a developer of the photosensitive coating film at the exposed portion is increased than that of the unexposed portion whereby an image is formed and a plate is produced. The image region (unexposed portion to irradiation) remaining after plate-making is ink-receptive or hydrophobic and the region (exposed portion to irradiation) at which the film is dissolved and removed is water-receptive or hydrophilic by using a hydrophilic support or providing a hydrophilic layer between the photosensitive coating film and the support. In the field of the positive type lithographic PS plate, as a photosensitive coating film having such a function, it has been proposed a technique in which o-naphthoquinonediazide-5-sulfonic acid derivative and a phenol resin as disclosed in, for example, Japanese Patent Publications No. 3627/1962, No. 1954/1962, No. 28406/1968 and No. 9610/1970. However, irradiations disclosed in these references are ultraviolet rays corresponding to the absorption wavelength at the ultraviolet region possessed by the o-naphthoquinonediazide-5-sulfonic acid derivatives. It is obvious that the films disclosed in the above-mentioned references do not have any light-sensitivity to the irradiation at the near infrared region.

On the other hand, it is remarkable in progress of laser beam in recent years, and particularly, a high power and small sized semiconductor laser which irradiates infrared rays at the wavelength of 760 nm to 1200 nm or a solid laser can be easily available. By using these lasers as a recording light source, it becomes possible to directly make a plate with a high resolution from digital data of a computer, or the like. Thus, research and development of a heat mode plate-making material by a laser beam have become more aggressive. For example, in Japanese Registered Patent No. 2,577,718, a technique of using a phenol resin, a heat-decomposable onium salt and a near infrared rays-absorbing dye in combination is disclosed. Also, in Japanese Provisional Patent Publications No. 20629/1995, No. 138500/1997, No. 185160/1997 and No. 211863/1997, a technique of using a phenol resin, a latent type Bronsted acid and a near infrared rays-absorbing dye in combination is disclosed. By suitably controlling kinds, molecular weights, composition ratio of the materials disclosed in the above references, a positive type or a negative type infrared rays-sensitive printing plate can be obtained. However, it is the present status that an infrared rays-sensitive printing plate having both of high infrared rays-sensitivity, and excellent storage stability with a lapse of time as well as high printing endurance simultaneously has not yet been developed.

Also, in Japanese Patent Publication No. 44416/1981, a technique in which an alkali-soluble resin, a basic compound and a photo-oxidation agent are used in combination is disclosed. On the other hand, in Japanese Provisional Patent Publication No. 60733/1974 or Journal of Imaging Science, vol. 34, p. 50 (1990), a technique of using a basic compound having a nitro group as a substituent which functions as a photooxidation agent in the molecule and an alkali-soluble resin in combination is disclosed. However, the irradiation to be used for recording in these techniques is ultraviolet rays corresponding to absorption at the ultraviolet region possessed by the photo-oxidation agent itself or the basic substance itself. Thus, it has never been known about a combination of recording materials having sensitivity to infrared rays.

Moreover, in Japanese Provisional Patent Publications No. 3165/1998 and No. 153863/1998, a positive type photosensitive composition containing a resin having a hydrophilic group, a thiopyrylium salt having a specific structure or a metal chelate compound or a boron salt, and an infrared rays-absorbing dye in combination is disclosed. In these techniques, by mixing three components of (1) a resin, (2) an infrared rays-absorbing dye and (3) a thiopyrylium salt having a specific structure or a metal chelate compound or a boron salt, aggregates hardly soluble in an alkaline treating solution are formed and decomposition of the aggregates is induced by on/off of heat generated by an infrared laser irradiation, and the laser irradiated portion is dissolved and removed by the alkaline treating solution to form an image. Also, in Japanese Provisional Patent Publication No. 43847/1997, there is disclosed a technique in which a thin film is formed by a mixture comprising two components of a novolak resin and an infrared rays-absorber, change in crystallinity of the thin film is induced by irradiating infrared laser beam, whereby a resist material is formed by utilizing change in solubility of the thin film in the alkaline treating solution. However, laser sensitivities in these techniques are low and difference in solubilities between the infrared laser-irradiated portion and unirradiated portion to the alkaline treatment solution is small so that it is difficult to form a clear and sharp image.

SUMMARY OF THE INVENTION

An object of the present invention is to provide a positive type photosensitive composition which is capable of directly making a plate from digital data of a computer, etc. by recording with the use of a semiconductor laser which irradiates near infrared rays, which is excellent in stability at storage and has good printing endurance at printing. The above object of the present invention can be accomplished by using a positive type photosensitive composition which comprises a support, and a recording layer provided thereon containing at least a polymer which is soluble in an alkaline developer, a near infrared rays-absorbing dye and a compound which lowers solubility of said polymer in the alkaline developer, wherein a contact angle of said recording layer is 70° or higher and the contact angle is lowered by irradiating a near infrared rays laser.

DESCRIPTION OF THE PREFERRED EMBODIMENTS

In a preferred embodiment of the present invention, a near infrared rays-sensitive composition of the present invention comprises a support and a recording layer provided thereon containing at least (1) a polymer soluble in an alkaline developer, (2) at least one of a dihydropyridine having a specific structure, a pyrylium salt, a carbamate, a carbinol and a pinacol, and (3) a near infrared rays-absorbing dye having a specific structure. The action and mechanism of the photosensitive composition according to the present invention are not yet clear, but it can be estimated that by uniformly mixing three components of (1) a polymer soluble in an alkaline developer, (2) at least one of a dihydropyridine having a specific structure, a pyrylium salt, a carbamate, a carbinol and a pinacol, and (3) a near infrared rays-absorbing dye having a specific structure, aggregates or flocculates which are hardly soluble in an alkaline treating solution are formed, and the aggregates or flocculates are deflocculated by irradiation of near infrared laser beam, and further lowering in the contact angle of the recording layer is induced by the deflocculation of the aggregates or flocculates to form an image. A lowered value of the contact angle of a recording layer having the contact angle of 70° or higher caused by irradiation of near infrared laser beam is inherently an extremely small value as 10° or less. However, it is a surprising fact that a large development latitude can be obtained from the small difference in the contact angles. On the other hand, in the present invention, no compound which is unstable to heat or ultraviolet rays such as a heat-decomposable sulfonium salt, iodonium salt, etc. is used so that it can be provided a positive type photosensitive composition which is excellent in stability at storage and has stable characteristics even when it is handled at a light room.

As the dihydropyridine compound to be used in the recording layer, a compound represented by the following formula (I) can be used. The compound may be used in combination of two or more.

(I)

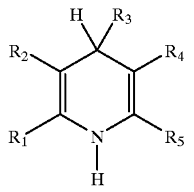

wherein $R_1$ and $R_5$ may be the same or different from each other and each represent an alkyl group; $R_2$ and $R_4$ may be the same or different from each other and each represent —COOR' group, —COR' group or —CN group where R' represents an alkyl group, an aralkyl group or an aryl group; and $R_3$ represents an alkyl group, an alkenyl group, an aralkyl group, an aralkenyl group, an aryl group or an aromatic heterocyclic residue.

Specific examples of the substituents $R_1$ and $R_5$ may include an alkyl group having 1 to 6 carbon atoms such as a methyl group, an ethyl group and the like.

Specific examples of the substituents $R_2$ and $R_4$ may include an ester residue such as a methoxycarbonyl group, an ethoxycarbonyl group, a t-butoxycarbonyl group, a benzyloxycarbonyl group, etc.; an acyl group such as an acetyl group, a benzoyl group, etc.; or a cyano group. $R_2$ and $R_4$ may further have a substituent(s).

Specific examples of the substituent $R_3$ may include an alkyl group having 1 to 10 carbon atoms such as a methyl group, an ethyl group, a n-octyl group, etc.; an alkenyl group having 2 to 12 carbon atoms such as a 1-propenyl group, a 3-cyclohexenyl group, etc.; an aralkyl group such as a benzyl group, a phenethyl group, etc.; an aralkenyl group such as a styryl group, a cinnamyl group, etc.; an aryl group such as a phenyl group, a naphthyl group, 4-methylphenyl group, etc.; or an aromatic heterocyclic residue such as a 4-pyridyl group, 2-furyl group, etc. $R_3$ may further have a substituent(s).

As the pyrylium salt to be used in the recording layer, a compound represented by the following formula (II), (III) or (IV) can be used. The compound may be used in combination of two or more.

(II)

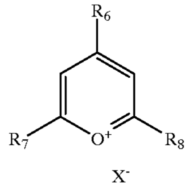

wherein $R_6$, $R_7$ and $R_8$ may be the same or different from each other and each represent an alkyl group, an aryl group or a styryl group; and $X^-$ represents a counter anion such as a perchlorate ion, a tetrafluoroborate ion, a hexafluoroborate ion, etc.

(III)

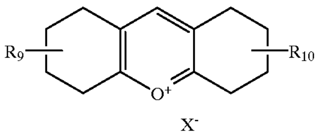

wherein $R_9$ and $R_{10}$ which are substituents on the cyclohexane ring, may be the same or different from each other and each represent a hydrogen atom, an alkyl group or a halogen atom; and $X^-$ represents a counter anion such as a perchlorate ion, a tetrafluoroborate ion, a hexafluoroborate ion, etc.

(IV)

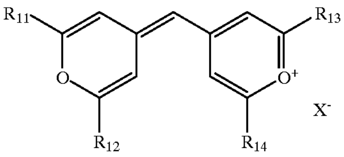

wherein $R_{11}$, $R_{12}$, $R_{13}$ and $R_{14}$ may be the same or different from each other and each represent an alkyl group or an aryl group; and $X^-$ represents a counter anion such as a perchlorate ion, a tetrafluoroborate ion, a hexafluoroborate ion, etc.

Specific examples of the substituents $R_6$, $R_7$ and $R_8$ in the above formula (II) may include an alkyl group having 1 to 4 carbon atoms such as a methyl group, etc.; an aryl group such as a phenyl group, a 4-methylphenyl group, a 4-chlorophenyl group, a 4-methoxyphenyl group, etc.; or a styryl group, a 4-dimethylaminostyryl group, etc.

Specific examples of the substituents $R_9$ and $R_{10}$ in the above formula (III) may include an alkyl group having 1 to 6 carbon atoms such as a methyl group, an ethyl group, a n-propyl group, an isopropyl group, a n-butyl group, a t-butyl group, etc.; or a halogen atom such as a chlorine atom, a bromine atom, etc.

Specific examples of the substituents $R_{11}$, $R_{12}$, $R_{13}$ and $R_{14}$ in the above formula (IV) may include an alkyl group having 1 to 4 carbon atoms such as a methyl group, an ethyl group, etc.; an aryl group such as a phenyl group, a 4-methylphenyl group, etc.

$X^-$ in the formulae (II), (III) and (IV) represents a counter anion such as a perchlorate ion, a tetrafluoroborate ion, a hexafluoroborate ion, etc.

As the carbamate to be used in the recording layer, a compound represented by the following formula (V), (VI) or (VII) can be used. The compound may be used in combination of two or more.

(V)

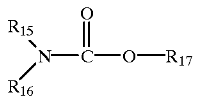

wherein $R_{15}$ represents an aryl group, an alkyl group or an aralkyl group; $R_{16}$ represents a hydrogen atom, an aryl group, an alkyl group or an aralkyl group; or $R_{15}$ and $R_{16}$ may be bonded to form a cyclic hydrocarbon residue; and $R_{17}$ represents an aryl group, an alkyl group or an aralkyl group.

(VI)

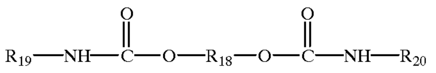

wherein $R_{18}$ represents a divalent group constituted by an aliphatic hydrocarbon residue, an aromatic hydrocarbon residue or a heterocyclic residue; and $R_{19}$ and $R_{20}$ may be the same or different from each other and each represent an aryl group, an alkyl group or an aralkyl group.

(VII)

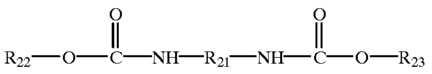

wherein $R_{21}$ represents a divalent group constituted by an aliphatic hydrocarbon residue or an aromatic hydrocarbon residue; and $R_{22}$ and $R_{23}$ may be the same or different from each other and each represent an aryl group, an alkyl group or an aralkyl group.

Specific examples of the substituents $R_{15}$ and $R_{16}$ in the formula (V) may include an aryl group such as a phenyl group, a p-methylphenyl group, a 4-methoxyphenyl group, a 2-tri fluoromethylphenyl group, a 1-naphthyl group, etc.; an alkyl group having 1 to 20 carbon atoms such as a n-propyl group, a n-hexyl group, a cyclohexyl group, a n-octadecyl group, etc.; or an aralkyl group such as a benzyl group, a phenethyl group, etc. Examples of a cyclic hydrocarbon residue formed by bonding $R_{15}$ and $R_{16}$ may include a hydrocarbon residue which forms, for example, piperidine, pyrolidine, 1,2,3,4-tetrahydroisoquinoline, etc.

Specific examples of the substituent $R_{17}$ in the formula (V) may include an aryl group such as a phenyl group, a 4-methoxyphenyl group, etc.; an alkyl group having 1 to 10 carbon atoms such as an ethyl group, a n-hexyl group, etc.; or an aralkyl group such as a benzyl group, a 1,2,3,4-tetrahydro-1-naphthyl group, a phenethyl group, etc., which may be further substituted by a substituent(s).

Specific examples of the substituent $R_{18}$ in the formula (VI) may include a divalent aliphatic hydrocarbon residue such as an alkylene group having 2 to 20 carbon atoms including an ethylene group, a propylene group, a hexamethylene group, etc.; a divalent aromatic hydrocarbon residue such as a phenylene group, a p-xylylene group, a m-xylylene group, a naphthylene group, etc.; a heterocyclic residue such as a pyridin-2,6-dimethylene group, pyrazin-2,5-dimethylene group, etc., which may be further substituted by a substituent(s).

Specific examples of the substituents $R_{19}$ and $R_{20}$ in the formula (VI) may include an aryl group such as a phenyl group, a 3-methylphenyl group, a l-naphthyl group, etc.; an alkyl group having 1 to 10 carbon atoms such as an ethyl group, a n-propyl group, a t-butyl group, a n-hexyl group, etc.; or an aralkyl group such as a benzyl group, a phenethyl group, etc.

Specific examples of the substituent $R_{21}$ in the formula (VII) may include an aliphatic hydrocarbon residue such as a hexamethylene group, an isophorone residue, etc.; and an aromatic hydrocarbon residue such as a m-xylylene group, a p-xylylene group, etc.

Specific examples of the substituents $R_{22}$ and $R_{23}$ in the formula (VII) may include an aryl group such as a phenyl group, a 3-methylphenyl group, a 3,5-dimethylphenyl group, a 3-bromophenyl group, a naphthyl group, etc.; an alkyl group having 1 to 10 carbon atoms such as an ethyl group, a t-butyl group, a n-hexyl group, etc.; or an aralkyl group such as a benzyl group, a phenethyl group, etc., which may be further substituted by a substituent(s).

As the carbinol to be used in the recording layer, a compound represented by the following formula (VIII) can be used. The compound may be used in combination of two or more.

(VIII)

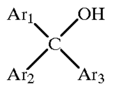

wherein $Ar_1$, $Ar_2$ and $Ar_3$ may be the same or different from each other and each represent an aryl group or a heterocyclic residue.

Specific examples of the substituents $Ar_1$, $Ar_2$ and $Ar_3$ in the formula (VIII) may include an aryl group such as a phenyl group, a 4-methylphenyl group, a 4-tert-butylphenyl group, a 2,4-dimethylphenyl group, a 2,4-dimethoxyphenyl group, a 1-naphthyl group, etc.; or a heterocyclic residue such as a 4-pyridyl group, etc., which may be further substituted by a substituent(s).

As the pinacol to be used in the recording layer, a compound represented by the following formula (IX) can be used. The compound may be used in combination of two or more.

(IX)

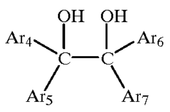

wherein $Ar_4$, $Ar_5$, $Ar_6$ and $Ar_7$ may be the same or different from each other and each represent an aryl group.

Specific examples of the substituents $Ar_4$, $Ar_5$, $Ar_6$ and $Ar_7$ in the formula (IX) may include an aryl group such as a phenyl group, a 3-methylphenyl group, a 4-methylphenyl group, a 4-ethylphenyl group, a 4-tert-butylphenyl group, a 2,4-dimethylphenyl group, a 2,4-dimethoxyphenyl group, a biphenyl group, a 1-naphthyl group, etc., which may be further substituted by a substituent(s).

As the infrared rays absorbing dye to be added to the recording layer, a cyanine dye represented by the following formula (X) can be used. The compound may be used in combination of two or more.

Specific examples of the substituent $R_{24}$ in the above formula (X) may include a hydrogen atom, a halogen atom such as a chlorine atom, a bromine atom, etc., an alkyl group having 1 to 6 carbon atoms such as a methyl group, an ethyl group, etc., or a diphenylamino group. Specific examples of the substituents $R_{25}$ and $R_{26}$ in the above formula (X) may include an alkyl group having 1 to 20 carbon atoms such as a methyl group, an ethyl group, a butyl group, etc., an alkoxyalkyl group having 3 to 20 carbon atoms such as a methoxyethyl group, an ethoxypropyl group, an ethoxybutyl group, etc., an acyloxyalkyl group having 4 to 20 carbon atoms such as an acetoxyethyl group, an acetoxypropyl group, a benzoyloxyethyl group, etc.; or a sulfoalkyl group having 2 to 6 carbon atoms such as a sulfoethyl group, a sulfopropyl group, a sulfobutyl group, etc., and the sulfoalkyl group is in the form of a salt of an alkali metal such as sodium, potassium, etc. Specific examples of the substituents $R_{27}$ and $R_{28}$ in the above formula (X) may include a hydrogen atom, a halogen atom such as a chlorine atom, a bromine atom, etc., an alkoxy group having 1 to 6 carbon atoms such as a methoxy group, an ethoxy group, etc., or a phenyl group, and when $R_{27}$ or $R_{28}$ represents a phenyl group, it may be fused with the phenyl group of the dye skeleton to form a naphthalene ring. Specific examples of the substituent $Z_1$ in the above formula (X) is a substituent on carbon atoms of the dye skeleton, and may include a (X)

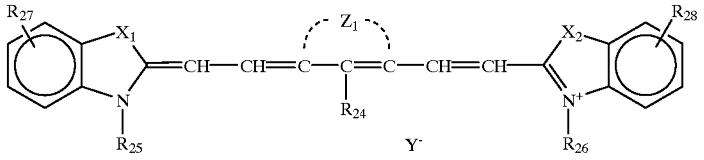

wherein $R_{24}$ represents a hydrogen atom, a halogen atom, an alkyl group or a diphenylamino group; $R_{25}$ and $R_{26}$ may be the same or different from each other and each represent an alkyl group, an alkoxyalkyl group, an acyloxyalkyl group or a sulfoalkyl group; $R_{27}$ and $R_{28}$ may be the same or different from each other and each represent a hydrogen atom, a halogen atom, an alkoxy group or a phenyl group, and when $R_{27}$ or $R_{28}$ represents a phenyl group, it may be fused with the phenyl group of the dye skeleton to form a naphthalene ring; $Z_1$ is a substituent on carbon atoms of the dye skeleton, and represents a divalent hydrocarbon group forming a cyclohexene ring or a cyclopentene ring with the carbon atoms of the dye skeleton, or independent two substituents selected from a hydrogen atom and an alkyl group; $X_1$ and $X_2$ may be the same or different from each other and each represent a sulfur atom, a methylene group which may have one or two substituents, or an unsubstituted vinylene group, and the substituent(s) of the methylene group is selected from an alkyl group having 1 to 6 carbon atoms or a hydrocarbon residue which forms a spiro ring having 3 to 6 carbon atoms; $Y^-$ represents a pair anion of the dye, but when $R_{25}$ and $R_{26}$ both represent sulfoalkyl groups, the dye itself becomes a neutral molecule so that it is not necessary.

divalent hydrocarbon group forming a cyclohexene ring or a cyclopentene ring with the carbon atoms of the dye skeleton, or independent two substituents selected from a hydrogen atom and an alkyl group having 1 to 6 carbon atoms such as a methyl group, an ethyl group, etc. Specific examples of the substituents $X_1$ and $X_2$ in the above formula (X) may include a sulfur atom, a methylene group which may have one or two substituents, or an unsubstituted vinylene group, and the substituent(s) of the methylene group is selected from an alkyl group having 1 to 6 carbon atoms such as a methyl group, an ethyl group, etc., or a hydrocarbon residue which forms a spiro ring having 3 to 6 carbon atoms such as a cyclohexyl group, etc. Specific examples of the substituents $Y^-$ in the above formula (X) represents a pair anion of the dye such as a perchlorate ion, a tetrafluoroborate ion, a hexafluoroborate ion, an iodine ion, etc., but when $R_{25}$ and $R_{26}$ both represent sulfoalkyl groups, the dye itself becomes a neutral molecule so that it is not necessary.

Next, specific examples of the compound represented by the formula (I) to be used in the positive type photosensitive composition of the present invention are shown below, but the present invention is not limited by these.

(I-1)
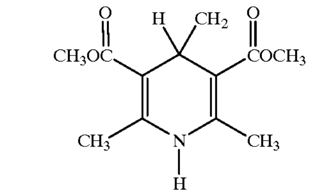
(I-2)
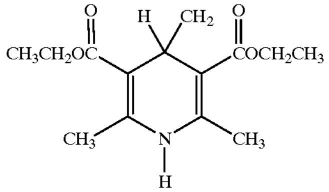
(I-3)
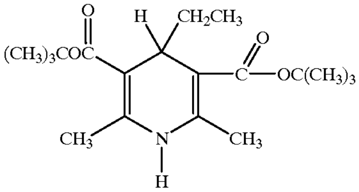
(I-4)
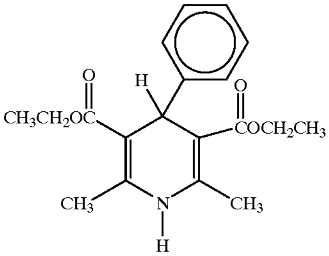
(I-5)
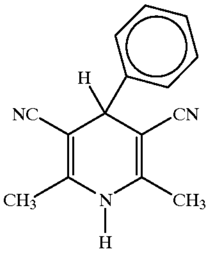
(I-6)
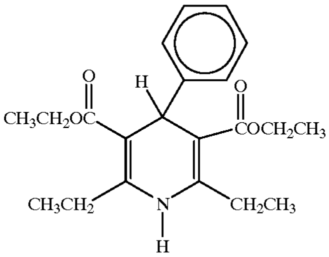
-continued
(I-7)
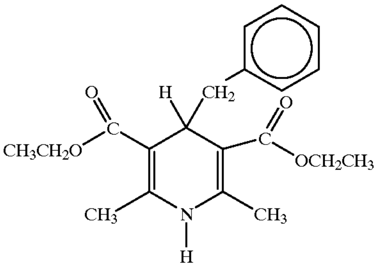
(I-8)
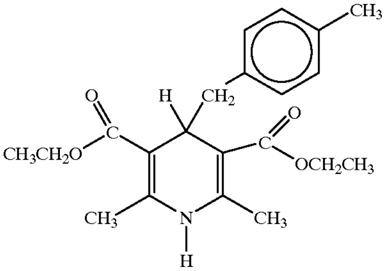
(I-9)
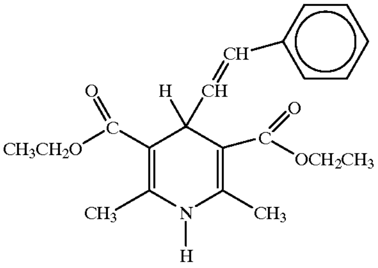
(I-10)
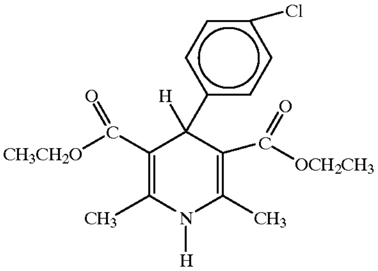
(I-11)
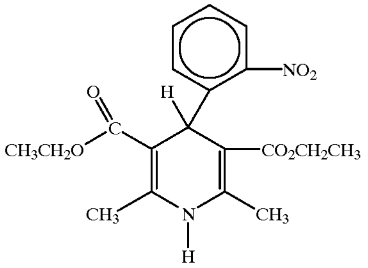

-continued (I-12)

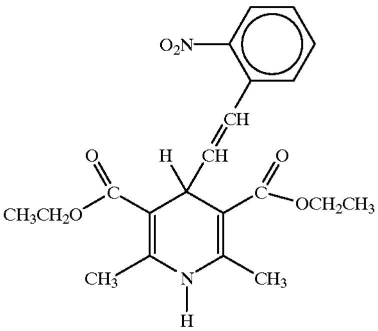

(I-13)

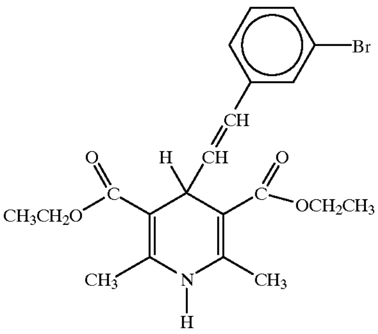

(I-14)

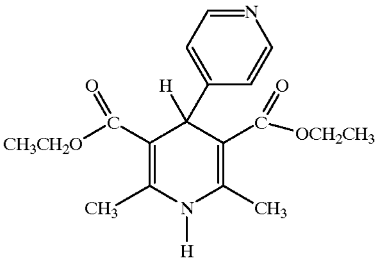

(I-15)

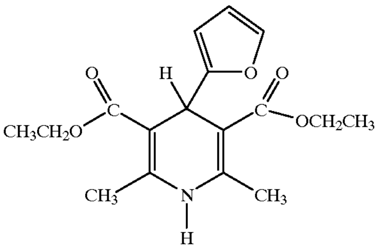

(I-16)

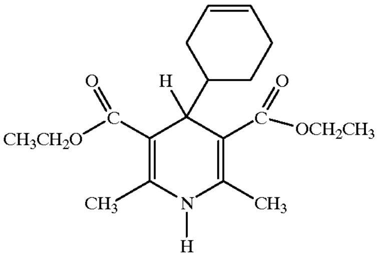

-continued (I-17)

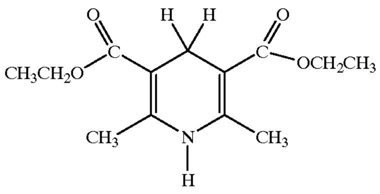

(I-18)

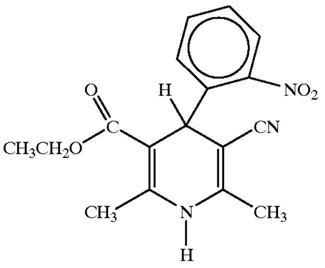

(I-19)

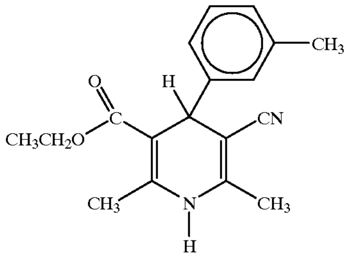

(I-20)

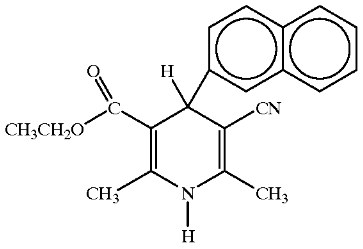

(I-21)

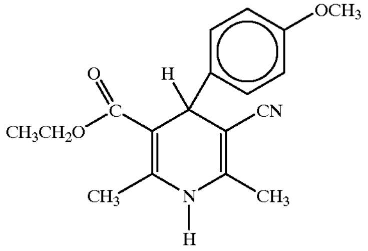

These dihydropyridine compound can be easily synthesized according to the synthesis methods of pyridine by Hantzsch as described in Journal of Organic Chemistry, vol. 30, p. 1914 (1965), Journal of Chemical Society (1946) p.884, Organic Synthesis (Collective Volume), vol. 2, p. 214, or Angevante Chemie (International edition), vol. 20, p. 762 (1981), etc.

Next, specific examples of the compound represented by the formula (II) to be used in the positive type photosensitive composition of the present invention are shown below, but the present invention is not limited by these.

(II-1)

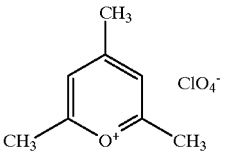

(II-2)

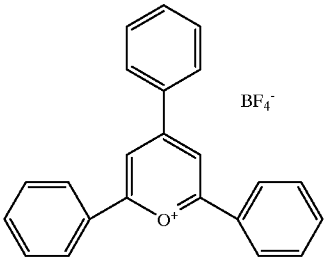

(II-3)

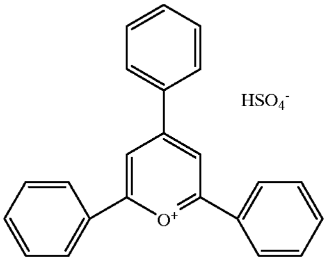

(II-4)

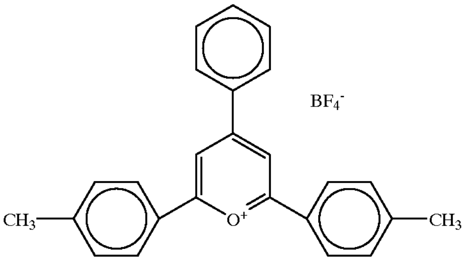

(II-5)

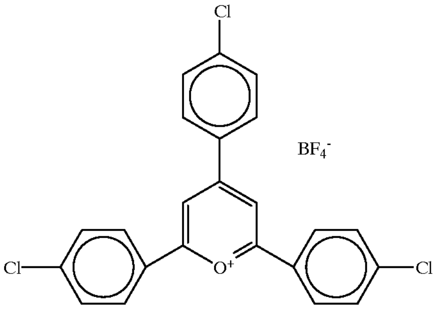

(II-6)

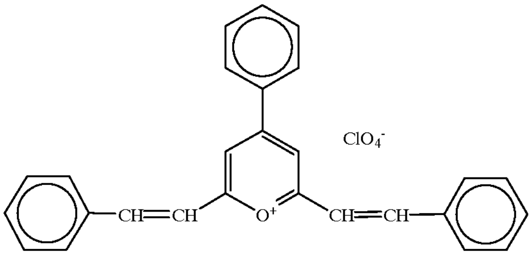

-continued (II-7)

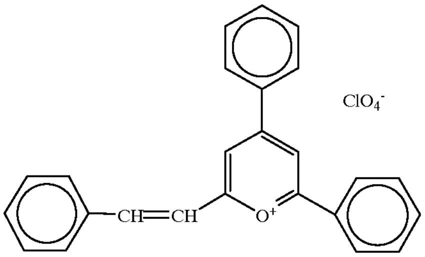

(II-8)

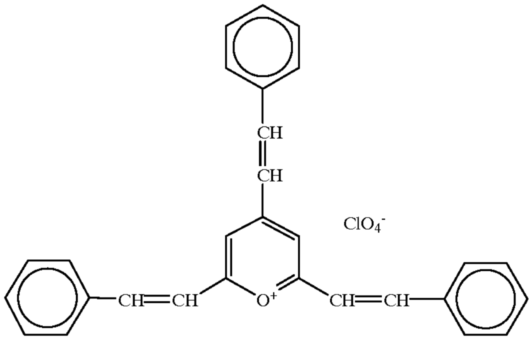

(II-9)

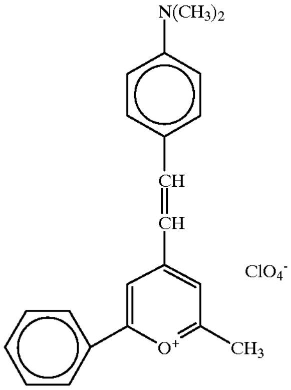

These compounds can be easily synthesized according to the synthesis methods as described in Organic Synthesis, vol. 44, p.101 (1964), Helvetica Chemica Acta, vol. 34, p.2290, Helvetica Chemica Acta, vol. 45, p.1918 (1962), Tetrahedron Supplement vol. 7, p.1 (1966), etc.

Next, specific examples of the compound represented by the formula (III) to be used in the positive type photosensitive composition of the present invention are shown below, but the present invention is not limited by these.

(III-1)

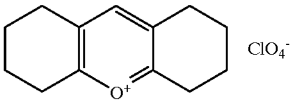

-continued (III-2)

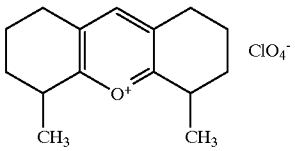

(III-3)

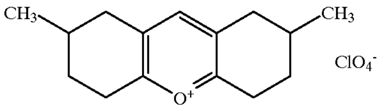

(III-4)

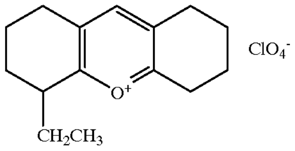

(III-5)

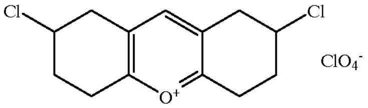

These compounds can be synthesized according to the synthesis methods as described in Chemische Berichte, vol. 102 (1969) p.1214, Tetrahedron, vol. 22 (1966) p.1821, etc.

Next, specific examples of the compound represented by the formula (IV) to be used in the positive type photosensitive composition of the present invention are shown below, but the present invention is not limited by these.

(IV-1)

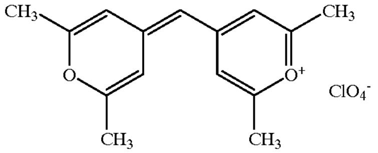

(IV-2)

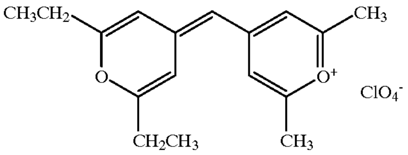

(IV-3)

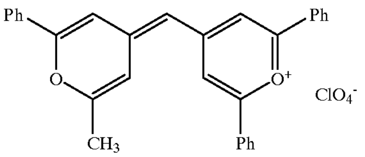

(IV-4)

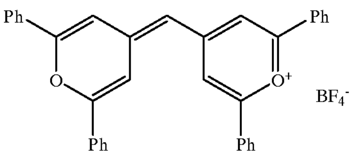

These compounds can be synthesized according to the synthesis methods as described in Tetrahedron, vol. 27 (1971) p.3503, etc.

Next, specific examples of the compound represented by the formula (V) to be used in the positive type photosensitive composition of the present invention are shown below, but the present invention is not limited by these.

(V-1)

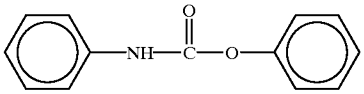

(V-2)

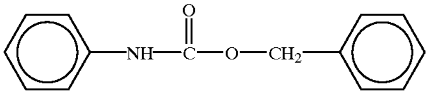

(V-3)

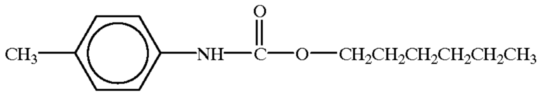

(V-4)

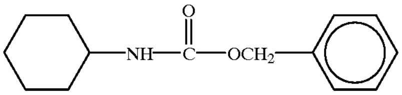

(V-5)

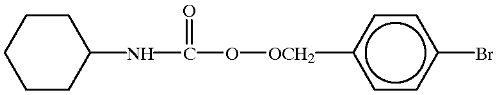

(V-6)

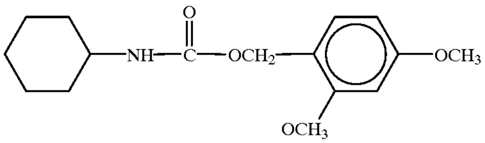

(V-7)

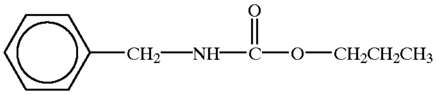

(V-8)

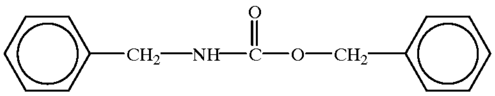

(V-9)

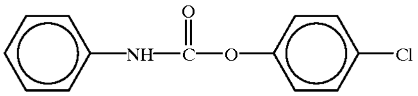

(V-10)

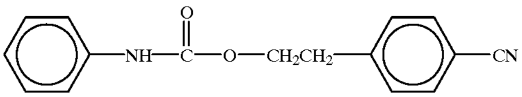

-continued
(V-11)
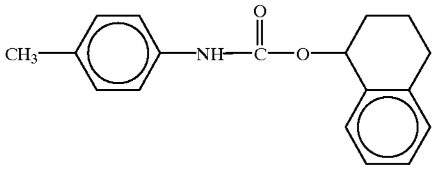
(V-12)
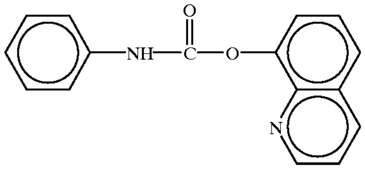
(V-13)
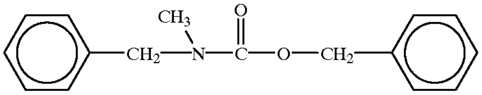
(V-14)
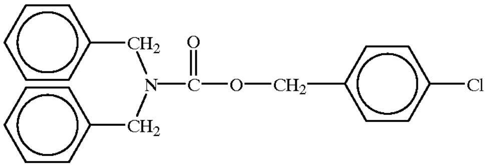
-continued
(V-15)
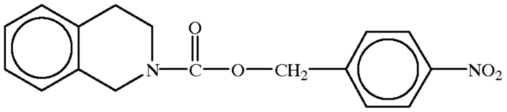
(V-16)
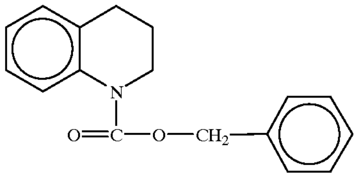
Next, specific examples of the compound represented by the formula (VI) to be used in the positive type photosensitive composition of the present invention are shown below, but the present invention is not limited by these.
(VI-1)
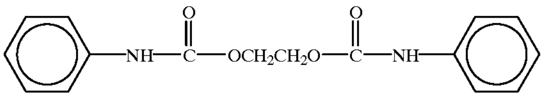
(VI-2)
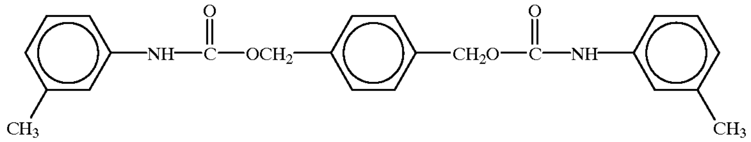
(VI-3)
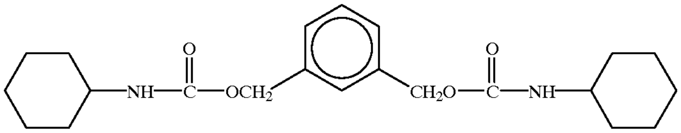
(VI-4)
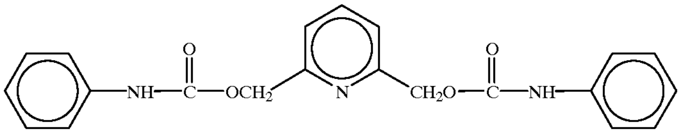
(VI-5)
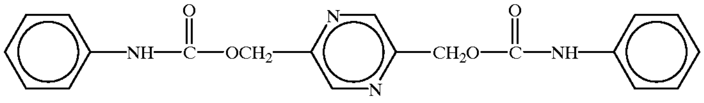

-continued
(VI-6)
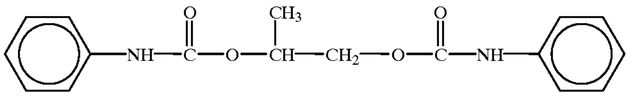
(VI-7)
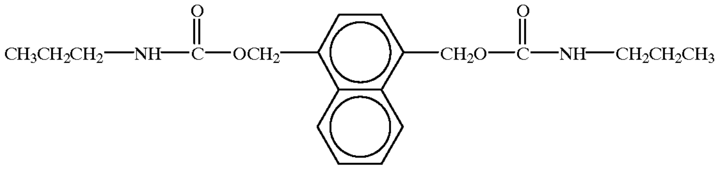
(VI-8)
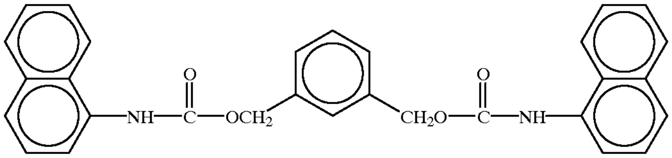
(VI-9)
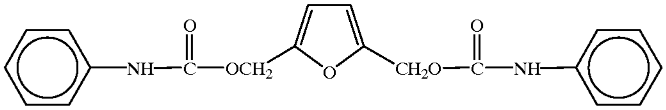
(VI-10)
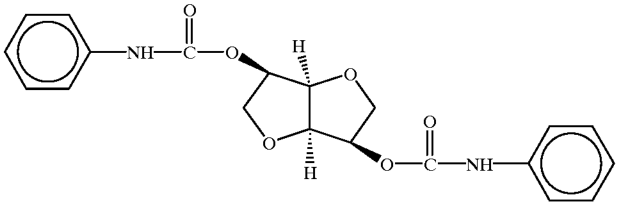
Next, specific examples of the compound represented by the formula (VII) to be used in the positive type photosensitive composition of the present invention are shown below, but the present invention is not limited by these.
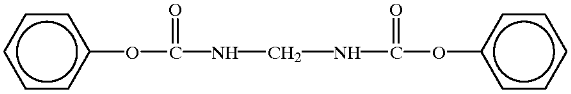
(VII-1)
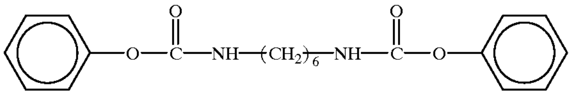
(VII-2)
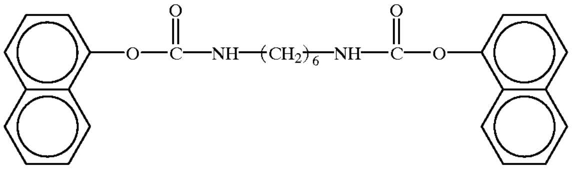
(VII-3)
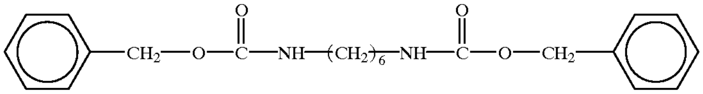

-continued
(VII-4)
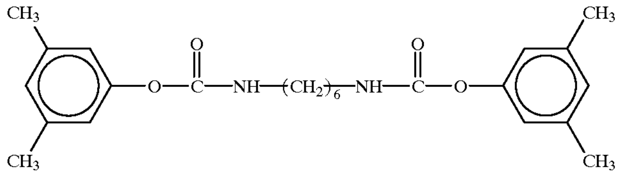
(VII-5)
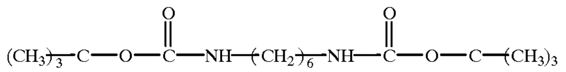
(VII-6)
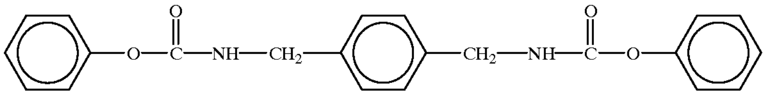
(VII-7)
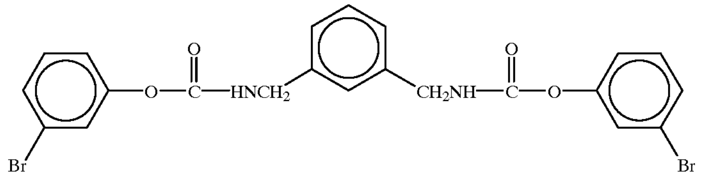
(VII-8)
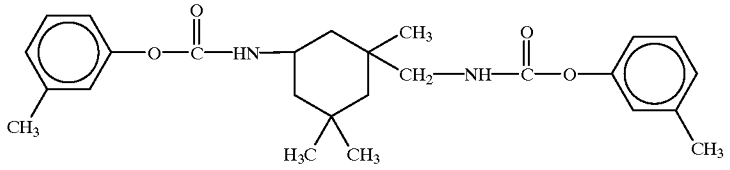
(VII-9)
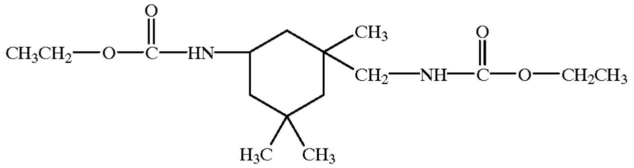
(VII-10)
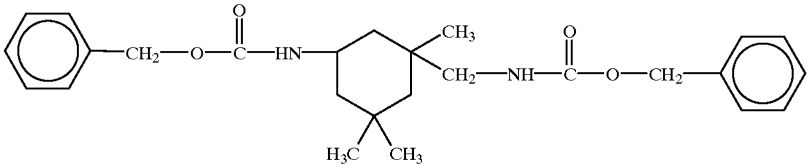
Next, specific examples of the compound represented by the formula (VIII) to be used in the positive type photosensitive composition of the present invention are shown below, but the present invention is not limited by these.
(VIII-1)
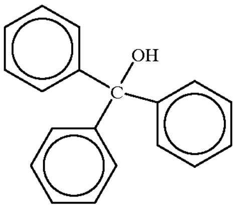
-continued
(VIII-2)
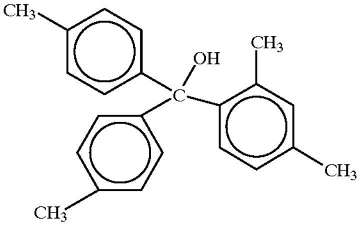

-continued (VIII-3)

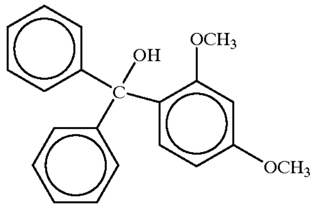

(VIII-4)

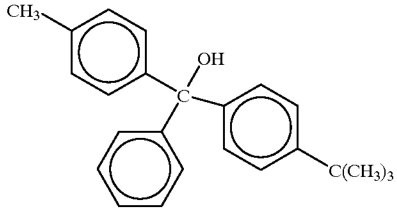

(VIII-5)

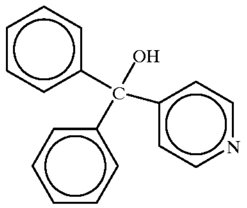

Next, specific examples of the compound represented by the formula (IX) to be used in the positive type photosensitive composition of the present invention are shown below, but the present invention is not limited by these.

(IX-1)

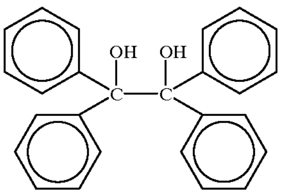

-continued (IX-2)

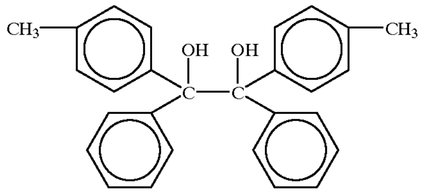

(IX-3)

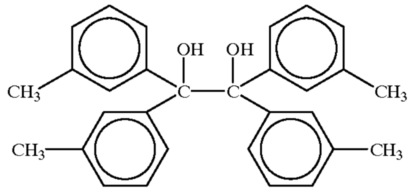

(IX-4)

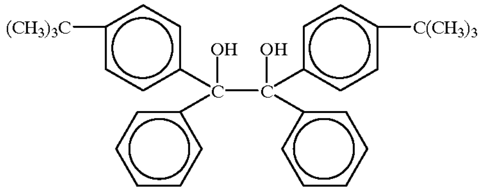

(IX-5)

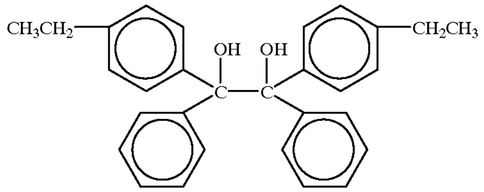

Next, specific examples of the compound represented by the formula (X), among the near infrared absorption dyes, to be used in the positive type photosensitive composition of the present invention are shown below, but the present invention is not limited by these.

(X-1)
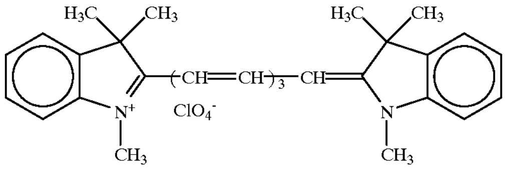
(X-2)
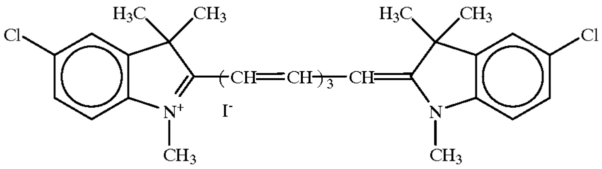
(X-3)
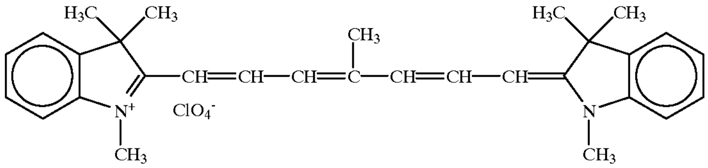
(X-4)
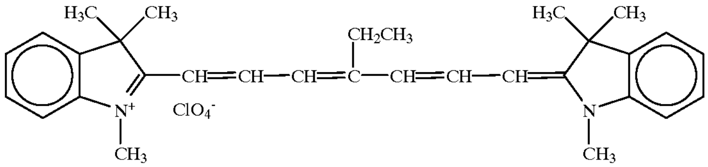
(X-5)
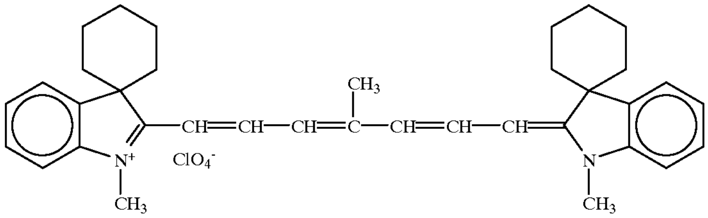
(X-6)
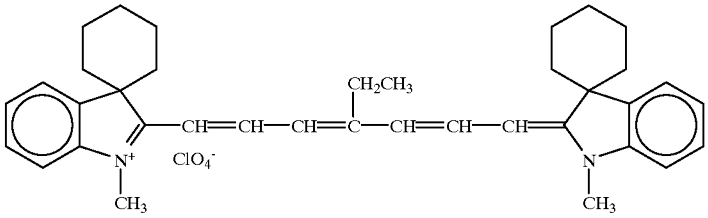
(X-7)
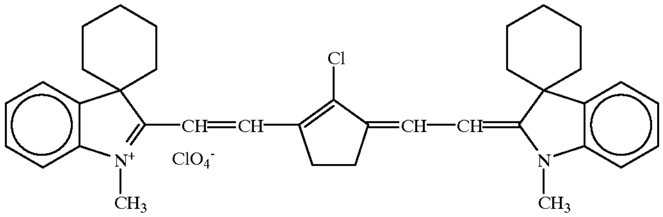

-continued
(X-8)
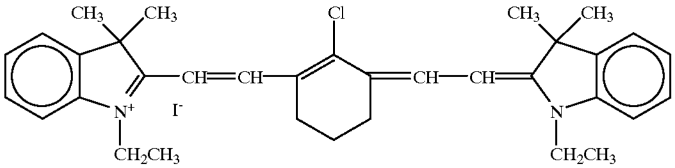
(X-9)
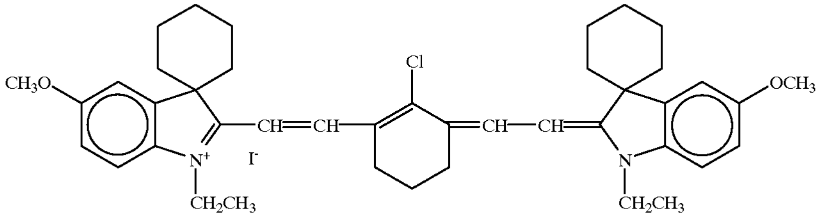
(X-10)
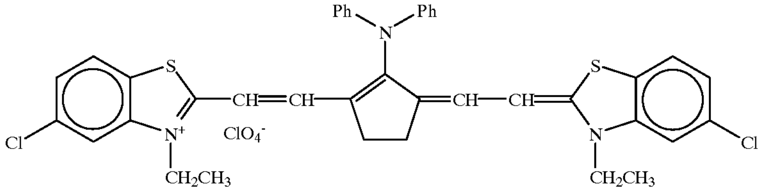
(X-11)
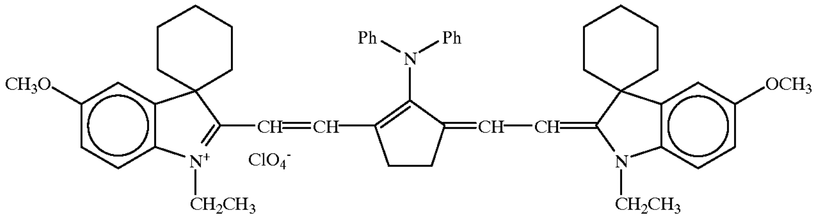
(X-12)
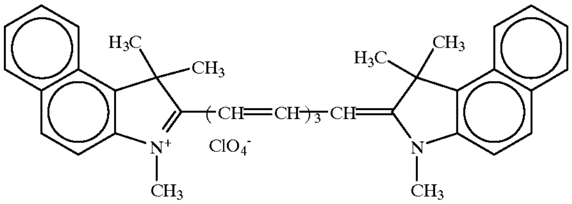
(X-13)
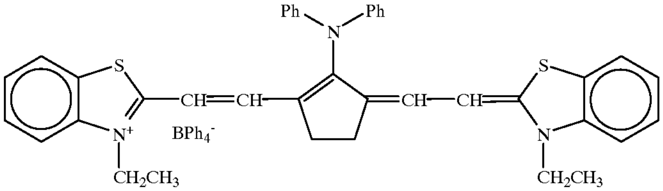
(X-14)
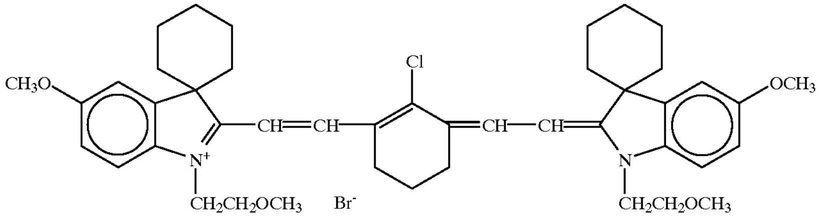

-continued (X-15)

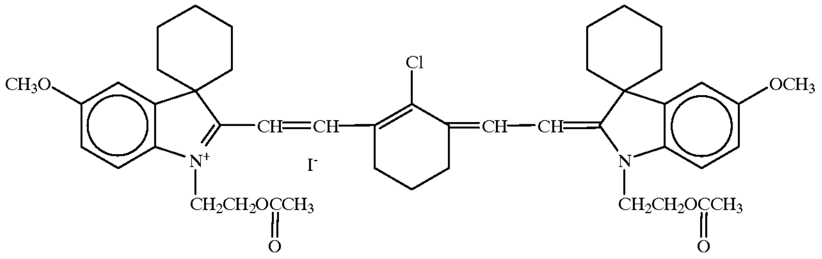

(X-16)

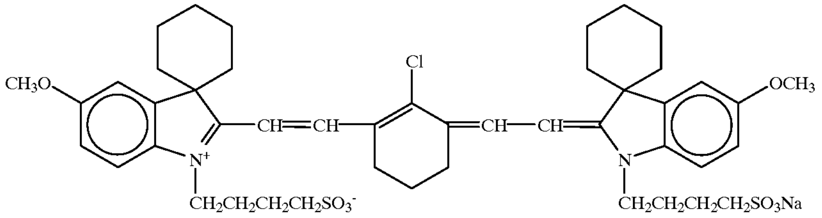

(X-17)

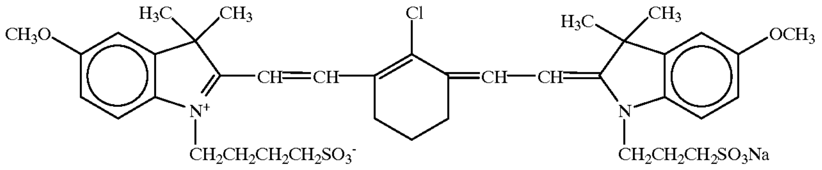

In the present invention, a near infrared rays absorption dye other than the compound of the formula (X) as mentioned above can be used, but in view of the preservation stability with a lapse of time of a positive type photosensitive material, it is particularly preferred to use the compound represented by the above formula (X) as a near infrared rays absorption dye.

As the polymer soluble in at least an alkaline developer to be used in the positive type photosensitive composition of the resent invention, a phenol resin is preferred, more specifically, a novolak resin, a resol resin, or a polyvinylphenol resin are preferred.

As the novolak resin, a material in which at least one aromatic hydrocarbon such as phenol, cresol, resorcinol, pyrogalol, bisphenol A, t-butylphenol, 1-nephthol, etc. ispolycondensed with an aldehyde such as formaldehyde, paraformaldehyde, acetaldehyde, benzaldehyde, etc., or a ketone such as acetone, methyl ethyl ketone, etc., in the presence of an acidic catalyst. As for the molecular weight of the novolak resin, it preferably has a weight average molecular weight (Mw) calculated on polystyrene measured by a gel permeation chromatography (GPC) analysis of 1,000 to 15,000, more preferably 1,500 to 10,000. As the resol resin, a material in which at least one aromatic hydrocarbon such as phenol, cresol, resorcinol, pyrogalol, bisphenol A, t-butylphenol, 1-nephthol, etc. is polycondensed with an aldehyde such as formaldehyde, paraformaldehyde, acetaldehyde, benzaldehyde, etc., or a ketone such as acetone, methyl ethyl ketone, etc., in the presence of a basic catalyst. As for the molecular weight of the resol resin, it preferably has a Mw measured by a GPC analysis of 1,000 to 5,000, more preferably 1,500 to 3,000. As the polyvinylphenol resin, there may be mentioned a homopolymer or a copolymer of two or more kinds of hydroxystyrene monomers selected from o-hydroxystyrene, p-hydroxystyrene, 2-(m-hydroxyphenyl)propylene, etc. Also, it may be a resin in which a part of the hydroxyl groups of the polyvinylphenol is protected by a t-butoxycarbonyl group, a pyranyl group, a furanyl group, etc. A Mw of the polyvinylphenol resin is preferably 1,000 to 100,000, particularly preferably 1,500 to 50,000.

Among the above-mentioned resins, the novolak resin is particularly preferred in the point of giving good preservation stability of the positive type photosensitive resin composition and capable of maintaining mechanical strength of the formed images.

An amount of the polymer soluble in an alkaline developer to be used in the recording layer of the positive type photosensitive composition of the present invention is generally 40% by weight to 95% by weight based on the total solid component of said recording layer, preferably 60% by weight to 90% by weight.

An amount of the compound represented by the formula (I) to be used in the recording layer of the positive type photosensitive composition of the present invention is generally 0.5% by weight to 30% by weight based on the total solid component of said recording layer, preferably 1% by weight to 10% by weight. When the amount of the compound of the formula (I) is too much, solubility of the non-image portion (laser irradiated portion) to the alkaline developer is lowered, while if it is too little, solubility resistance of the image portion (laser non-irradiated portion) to the alkaline developer becomes poor.

An amount of the compound represented by the formula (II), (III) or (IV) to be used in the recording layer of the positive type photosensitive composition of the present invention is generally 0.5% by weight to 30% by weight based on the total solid component of said recording layer, preferably 1% by weight to 10% by weight. When the amount of the compound of the formula (II), (III) or (IV) is too much, solubility of the non-image portion (laser irradiated portion) to the alkaline developer is lowered, while if it is too little, solubility resistance of the image portion (laser non-irradiated portion) to the alkaline developer becomes poor.

An amount of the compound represented by the formula (V), (VI), (VII), (VIII) or (IX) to be used in the recording layer of the positive type photosensitive composition of the present invention is generally 0.5% by weight to 30% by weight based on the total solid component of said recording layer, preferably 1% by weight to 10% by weight. When the amount of the compound of the formula (V), (VI), (VII), (VIII) or (IX) is too much, solubility of the non-image portion (laser irradiated portion) to the alkaline developer is lowered, while if it is too little, solubility resistance of the image portion (laser non-irradiated portion) to the alkaline developer becomes poor.

As for the near infrared absorption dye, in combination with the compound represented by the formula (X), a commercially available dye or pigment having a local maximum absorption at the wavelength of 700 nm to 1200 nm may be used. More specifically, there may be mentioned an azo dye, a metal complex azo dye, a naphthoquinone dye, an anthraquinone dye, a phthalocyanine dye, a squarylium dye, a metal thiolate complex, a thiopyrylium salt, an insoluble azo pigment, a chelete azo pigment, a phthalocyanine series pigment, a perylene series pigment, a perinone series pigment, carbon black, an aminium dye, a diimmoniumdye, etc. Among these, a phthalocyanine dye, an aminium dye and a diimmonium dye all of which are soluble in a solvent are particularly preferred since they do not lower mechanical strength of the images and do not lower solubility at the non-image portion (laser irradiated portion to the alkaline developer. When other kind of near infrared absorption dye(s) is used in combination with the near infrared absorption dye represented by the formula (X), the other kind of the near infrared absorption dye may be added to the recording layer containing the near infrared absorption dye represented by the formula (X) or into an adjacent layer provided adjacent to the recording layer.

An amount of the near infrared absorption dyes to be used in the positive type photosensitive composition of the present invention is, when it is to be added to the recording layer, generally 1% by weight to 60% by weight based on the total solid components of the materials in the recording layer, preferably 5% by weight to 40% by weight. Further, when an aminium dye, a diimmonium dye, or a phthalocyanine dye (hereinafter abbreviated these dyes to as (b)) is used in the recording layer in combination with the near infrared absorption dye (hereinafter abbreviated the dye to as (a)) represented by the formula (X), amounts of the (a) and (b) to be used are 0.5/1 to 20/1 in terms of an addition weight ratio (b/a), preferably 1/1 to 10/1. When the near infrared absorption dye (b) is to be added to an adjacent layer adjacent to the recording layer, an amount of the (b) is generally 5% by weight to 70% by weight based on the total solid components of the materials in the adjacent layer, preferably 10% by weight to 50% by weight.

As the aminium dye or diimmonium dye, the following commercially available product can be used as the compound which has an absorption peak at a longer wavelength than 700 nm.

Aminium dye: IRG002, IRG 003 (trade name, available from Nihon Kayaku Co.)

Diiummonium dye: IRG022, IRG 023 (trade name, available from Nihon Kayaku Co.)

As the phthalocyanine dye, commercially available any dyes and pigments can be used. However, in view of not lowering solubility of the non-image portion (laser irradiated portion) to the alkaline developer, a phthalocyanine which is soluble in an organic solvent is particularly preferred. Particularly, the following commercially available phthalocyanine can be used.

Excolor IR-1, Excolor IR-3 (each trade name, available from Nihon Shokubai)

As the polymer soluble in an alkaline developer to be used in the adjacent layer, completely the same phenol resin to be used in the recording layer may be used. Also, in addition thereto, an acrylic resin, a polystyrene, etc. may further be used. More specifically, a polymer having the monomer unit shown below may be mentioned. That is, there may be mentioned N-(4-hydroxyphenyl)acrylamide, p-hydroxystyrene, p-hydroxyphenylmethacrylate, acrylic acid, methacrylic acid, maleic anhydride, itaconic acid, etc. Among these, a copolymer of at least one of the above-mentioned monomers and at least one monomer selected from styrene, methyl methacrylate, butyl acrylate, benzyl methacrylate, acrylonitrile, etc. A Mw of these resins is preferably 5,000 to 150,000, particularly preferably 10,000 to 100,000.

An amount of the polymer soluble in an alkaline developer to be used in the adjacent layer to the recording layer of the positive type photosensitive composition according to the present invention is generally 40% by weight to 95% by weight based on the total solid content of said adjacent layer, preferably 60% by weight to 90% by weight.

The adjacent layer of the positive type photosensitive composition according to the present invention may be provided at a middle portion of or between the recording layer and the support, or may be provided at the above layer of the recording layer. It is particularly preferred to provide the adjacent layer between the recording layer and the support to decrease ground fogging of the non-image portion (laser irradiated portion) after the treatment by the alkaline developer.

In the positive type photosensitive composition according to the present invention, in order to heighten stability to developing treatment, a nonionic surfactant such as sorbitan tristeareate, sorbitan monopalmitate, stearic acid monoglyceride, polyoxyethylene nonylphenyl ether, etc. may be added. An amount of these surfactant to be added in the photosensitive composition is preferably 0.05 to 15% by weight, particularly preferably 0.1 to 5% by weight based on the total weight of the photosensitive composition.

The positive type photosensitive composition according to the present invention can be produced by dissolving the constitutional components in a suitable solvent and coating it on a suitable support. Here, the solvent which can be used in the present invention may include an alcohol such as methanol, ethanol, 1-propanol, 1-methoxy-2-propanol, etc.;

an ether such as tetrahydrofuran (THF), 1,4-dioxane, 1,2-dimethoxyethane, ethylene glycol monomethyl ether, etc.; a ketone such as acetone, methyl ethyl ketone, cyclohexanone, methyl isobutyl ketone, etc.; an aromatic hydrocarbon such as toluene, xylene, etc.; an ester such as ethyl acetate, methyl acetate, isobutyl acetate, etc.; an amide such as N,N-dimethylformamide, N,N-dimethylacetamide, N-methylpyrrolidone, etc.; dimethylsulfoxide, water, or the like, but the present invention is not limited only by these solvents. These solvents may be used singly or in combination of two or more. A solid concentration of the coating solution of the photosensitive composition is preferably 1 to 50% by weight. Also, a coated amount on the support obtained after coating and drying is preferably 0.5 to 5.0 $g/m^2$. As a coating method, there may be mentioned a bar coater coating, a spinner coating, a spray coating, a curtain coating, a dip coating, an air knife coating, a blade coating a roll coating, or the like.

As the support to be used in the present invention, there may be mentioned a paper, a paper to which a plastic such as a polyethylene, etc., is laminated, metal such as aluminum, zinc, copper, etc., a plastic film such as a polyethylene terephthalate, polyethylene, polystyrene, polycarbonate, cellulose acetate, etc., aplastic to which a metal is deposited, or the like. As the support to be used in the present invention, preferred is a polyester film or an aluminum plate. Among these, an aluminum plate is particularly preferred since its dimensional stability is good and the cost is relatively inexpensive. A thickness of the aluminum plate is preferably 0.1 mm to 1 mm, particularly preferably 0.2 mm to 0.4 mm.

The aluminum plate is preferably used after subjecting to the conventionally know treatment(s) in the filed of the printing plate such as a degreasing treatment, surface roughening treatment, anodization treatment or the like. The surface of the aluminum plate to which the anodization treatment is carried out may be further subjected to a hydrophilic treatment by using sodium silicate, potassium fluorozirconate, polyvinylsulfonic acid, etc.

In the positive type photosensitive composition according to the present invention, a subbing layer may be provided on the support depending on necessity. As the subbing layer components, there may be mentioned, for example, carboxymethyl cellulose, dextrin, gum arabic, 2-aminoethylphosphonic acid, phenylphosphinic acid, phenylphosphinic acid, alkylphosphinic acid, glycine, b-alanine, triethanolamine hydrochloride, etc. These components may be used singly or incombination of two or more. A coated amount of the subbing layer is preferably 2 $mg/m^2$ to 200 $mg/m^2$.

A lithographic printing plate material can be prepared by using the positive type photosensitive composition of the present invention. This plate material is imagewisely exposed by a semiconductor laser which irradiates near infrared rays at a wavelength of 700 to 900 nm. As to an output power of the semiconductor laser, an apparatus having an output powder of 100 mW to 5 W is used. As to an exposure time of the near infrared rays laser to the photosensitive composition, depending on the output power of the semiconductor laser, it is selected from $0.1\times10^{-6}$ second to $1\times10^{-3}$ second. In the present invention, a developing treatment can be immediately carried out after exposure by a laser beam, and it is not necessary to carry out a heat treatment step, etc. between the laser beam exposure and the developing treatment.

With regard to the contact angle of the recording layer of the positive type photosensitive composition according to the present invention, it can be measured according to the droplet method in which a water drop of distilled water placed on the recording layer is measured by using a contact angle measuring apparatus. As for the measurement method, it can be measured according to the method described in "Shin-Jikken Kagaku Koza" (New Experiment Chemistry Lecture), vol. 18, p.97, published by Maruzen, Japan. Also, in a printing plate using a recording layer mainly comprising an oleophilic resin as an ink receptive layer, as a necessary condition for accepting an ink by the recording layer sufficiently, it is well-known fact in the field of the printing plate that the contact angle of the recording layer shall be at least 50° or more, preferably 70° or more. The recording layer of the positive type photosensitive composition according to the present invention has a contact angle of 70° or more, and the contact angle of the recording layer after irradiation of the near infrared laser lowers at most 10° but does not lower any more. However, by the developing treatment using an alkaline developer, a large development latitude can be obtained from the small difference in the contact angles.

After laser exposure, the plate material is subjected to developing treatment by an alkaline developer. As the developer, an alkali solution which has conventionally been known can be used. Such an alkali substance may include, for example, an inorganic alkali salt such as sodium silicate, potassium silicate, sodium phosphate, potassium phosphate, ammonium phosphate, sodium hydrogen phosphate, potassium hydrogen phosphate, ammonium hydrogen phosphate, sodium carbonate, potassium carbonate, ammonium carbonate, sodium hydrogen carbonate, potassium hydrogen carbonate, ammonium hydrogen carbonate, sodium borate, potassium borate, ammonium borate, sodium hydroxide, potassium hydroxide, ammonia, lithium hydroxide, or the like. Also, an organic alkali agent such as methylamine, dimethylamine, trimethylamine, ethylamine, diethylamine, triethylamine, n-butylamine, monoethanolamine, diethanolamine, triethanolamine, ethylenediamine, or the like may be used. These alkali agents may be used singly or in combination of two or more. Among these alkali agents, particularly preferred are aqueous silicate solution of an alkali metal such as sodium silicate, potassium silicate, etc.

Also, various surfactants or organic solvents may be added, if necessary, to the developing solution in order to control a developing rate, disperse development scum or heighten ink affinity at an image portion of a printing plate. Also, if necessary, an organic reducing agent such as hydroquinone, resorcine, catechol, etc., an inorganic reducing agent such as sodium sulfite, sodium hydrogen sulfite, etc., a defoaming agent, a chelating agent for softening hard water, etc. may be added to the developer.

The printing plate treated to the developer is subjected to post-treatment by a washing water, a rinsing solution containing a surfactant, a desensitizing solution containing gum arabic, a starch derivative, etc. When the positive type photosensitive composition according to the present invention is used in a printing plate, the plate is subjected to these treatments in combination variously, and then, applied to an offset printing machine, etc. to use it for printing a number of sheets.

EXAMPLES

In the following, effects of the present invention are explained in detail, but the present invention is not limited by these examples. Incidentally, all the "parts" and "%" in the examples mean "parts by weight" and "% by weight", respectively.

(Preparation of an aluminum plate)

An aluminum plate (Material: 1050) having a thickness of 0.30 mm was subjected to degreasing treatment (40° C. for 10 seconds) in a 5% aqueous sodium hydroxide solution, electrolytic etching (25° C., at a current density of 40 A/$dm^2$ for 30 seconds) in 0.5 mole/liter of an aqueous hydrochloric acid solution, desmutting treatment (30° C. for 10 seconds) in a 5% aqueous sodium hydroxide solution, and then, anodization treatment (20° C., at a current density of 5 A/$dm^2$ for one minute) in a 20% aqueous sulfuric acid solution to prepare an aluminum plate to be used for a support of a lithographic printing plate.

Example 1

A photosensitive solution prepared by the following prescription 1 was coated on an aluminum plate by a wire bar, and dried at 40° C. for 20 minutes to obtain a near infrared photosensitive composition plate having a coated amount after drying of 4.1 g/$m^2$. This plate was attached to a rotary drum, and scanning exposure was carried out by stopping down a semiconductor laser (output power: 500 mW) at 830 nm to 20 μm by a lens. The photosensitive composition plate after exposure was developed by using a developer MX1710 (trade name, available from Eastman Kodak AG, for a thermal printing plate) at 25° C. for 30seconds. A sensitivity was measured as an energy value from a drum rotation rate at which the resulting image provided 20 μm width, and the value was made an initial sensitivity. On the other hand, a sample prepared by the same prescription was allowed to stand in an oven at a temperature of 60° C. for 6 days whereby the sample was acceleratedly deteriorated. Then, an energy value was obtained in the same manner as mentioned above and the value was made a sensitivity after deterioration. Next, a sensitivity retaining ratio was obtained according to the following formula:

Sensitivity retaining ratio=(1/Sensitivity after deterioration)÷(1/Initial sensitivity)

| Prescription 1 | |
|---|---|
| m-Cresol novolak resin (BRM565; Mw = 2,500 to 3,500, available from Showa Kobunshi Co.) 20% methanol solution | 50 parts |
| Exemplary compound (X-9) 10% methanol solid dispersion | 40 parts |
| Exemplary compound (I-4) 5% methyl ethyl ketone solution | 10 parts |

The results are shown in Table 1.

TABLE 1

| Initial sensitivity | Sensitivity after deterioration | Sensitivity retaining ratio |
|---|---|---|
| 660 mJ/$cm^2$ | 750 mJ/$cm^2$ | 0.88 |

The thus obtained lithographic printing plate was mounted on an offset printing press (3200MCD, trade name, manufactured by Ryobi K.K.) and printing was carried out up to 150,000 sheets. As a result, printed materials excellent in printing quality without any stain at non-image portion were obtained.

Examples 2 to 7

According to the prescription 1 in Example 1, near infrared photosensitive composition was prepared by changing exemplary compounds of the formula (I) and the formula (X) variously. The same experiments were carried out as in Example 1 and the results are shown in Table 2. Also, the thus obtained lithographic printing plates were each mounted on an offset printing press (3200MCD, trade name, manufactured by Ryobi K.K.) and printing was carried out up to 150,000 sheets. As a result, printed materials excellent in printing quality without any stain at non-image portion were obtained.

TABLE 2

| | Compound (I) | Compound (X) | Initial sensitivity mJ/$cm^2$ | Sensitivity after deterioration mJ/$cm^2$ | Sensitivity retaining ratio |
|---|---|---|---|---|---|
| Example 2 | (I-4) | (X-10) | 700 | 950 | 0.74 |
| Example 3 | (I-4) | (X-7) | 630 | 730 | 0.86 |
| Example 4 | (I-8) | (X-1) | 1000 | 1220 | 0.82 |
| Example 5 | (I-11) | (X-11) | 750 | 890 | 0.84 |
| Example 6 | (I-16) | (X-13) | 650 | 950 | 0.68 |
| Example 7 | (I-19) | (X-9) | 850 | 1100 | 0.77 |

Example 8

A subcoating solution prepared by the following prescription 2 was coated on an aluminum plate for a printing plate by using a wire bar, and dried at 80° C. for 30 seconds. The coated amount thereof was 10 mg/$m^2$. Next, a photosensitive solution prepared by the following prescription 3 was coated on the subbing layer by a wire bar, and dried at 40° C. for 20 minutes to obtain a near infrared photosensitive composition plate having a coated amount after drying of 4.1 g/$m^2$.

This plate was attached to a rotary drum, and scanning exposure was carried out by stopping down a semiconductor laser (output power: 500 mW) at 830 nm to 20 μm by a lens. The photosensitive composition plate after exposure was developed by using a developer MX1710 (trade name, available from Eastman Kodak AG, for a thermal printing plate) at 25° C. for 30 seconds. A sensitivity was measured as an energy value from a drum rotation rate at which the resulting image provided 20 μm width, and the value was made an initial sensitivity. On the other hand, a sample prepared by the same prescription was allowed to stand in an oven at a temperature of 60° C. for 6 days whereby the sample was acceleratedly deteriorated. Then, an energy value was obtained in the same manner as mentioned above and the value was made a sensitivity after deterioration. Next, a sensitivity retaining ratio was obtained according to the following formula:

Sensitivity retaining ratio=(1/Sensitivity after deterioration)÷(1/Initial sensitivity)

| Prescription 2 | |
|---|---|
| β-Alanine | 0.1 part |
| Phenylphosphonic acid | 0.05 part |
| Methanol | 40 parts |
| Water | 60 parts |

| Prescription 3 | |
|---|---|
| m-Cresol novolak resin (BRM565; Mw = 2,500 to 3,500, available from Showa Kobunshi Co.) 20% methanol solution | 25 parts |
| o-Cresol novolak resin (CRG951; Mw = 1,200 to 1,400, available from Showa Kobunshi Co.) 20% methanol solution | 25 parts |
| Exemplary compound (X-9) 10% methanol solid dispersion | 40 parts |
| Exemplary compound (I-4) 5% methyl ethyl ketone solution | 10 parts |

The results are shown in Table 3.

TABLE 3

| Initial sensitivity | Sensitivity after deterioration | Sensitivity retaining ratio |
|---|---|---|
| 450 mJ/cm$^2$ | 550 mJ/cm$^2$ | 0.82 |

The thus obtained lithographic printing plate was mounted on an offset printing press (3200MCD, trade name, manufactured by Ryobi K.K.) and printing was carried out up to 150,000 sheets. As a result, printed materials excellent in printing quality without any stain at non-image portion were obtained.

Comparative example 1

A photosensitive solution prepared by the following prescription 4 was coated on the subbing layer by a wire bar, and dried at 40° C. for 20 minutes to obtain a near infrared photosensitive composition plate having a coated amount after drying of 4.1 g/m$^2$. This plate was attached to a rotary drum, and scanning exposure was carried out by stopping down a semiconductor laser (output power: 500 mW) at 830 nm to 20 um by a lens. The photosensitive composition plate after exposure was developed by using a developer MX1710 (trade name, available from Eastman Kodak AG, for a thermal printing plate) at 25° C. for 30 seconds. A sensitivity was measured as an energy value from a drum rotation rate at which the resulting image provided 20 μm width, and the value was made an initial sensitivity. On the other hand, a sample prepared by the same prescription was allowed to stand in an oven at a temperature of 60° C. for 6 days whereby the sample was acceleratedly deteriorated. Then, an energy value was obtained in the same manner as mentioned above and the value was made a sensitivity after deterioration. By allowing the sample to stand in an oven for 6 days, solubility at the laser beam irradiated portion was completely lost and the sample did not have any function as a printing plate. The results are shown in Table 4.

| Prescription 4 | |
|---|---|
| m-Cresol novolak resin (BRM565; Mw = 2,500 to 3,500, available from Showa Kobunshi Co.) 20% methanol solution | 10 parts |
| Cresol series resol resin (BSK316; Mw = 2,400, available from Showa Kobunshi Co.) 20% butanol solution | 40 parts |
| Exemplary compound (X-9) 10% methanol solid dispersion | 40 parts |
| Triphenylsulfonium tetrafluoroborate 5% methanol solution | 30 parts |

TABLE 4

| Initial sensitivity | Sensitivity after deterioration | Sensitivity retaining ratio |
|---|---|---|
| 660 mJ/cm$^2$ | Image could not be developed so that sensitivity could not be measured | Measurement impossible |

Example 9

A photosensitive solution prepared by the following prescription 5 was coated on an aluminum plate by a wire bar, and dried at 40° C. for 20 minutes to obtain a near infrared photosensitive composition plate having a coated amount after drying of 1.3 g/m$^2$. This plate was attached to a rotary drum, and scanning exposure was carried out by stopping down a semiconductor laser (output power: 500 mW) at 830 nm to 20 μm by a lens. The photosensitive composition plate after exposure was developed by using a developer having the following prescription 6 at 30° C. for 30 seconds. A sensitivity was measured as an energy value from a drum rotation rate at which the resulting image provided 20 μm width, and the value was made an initial sensitivity. On the other hand, a sample prepared by the same prescription was allowed to stand in an oven at a temperature of 60° C. for 6 days whereby the sample was acceleratedly deteriorated. Then, an energy value was obtained in the same manner as mentioned above and the value was made a sensitivity after deterioration. Next, a sensitivity retaining ratio was obtained according to the following formula:

Sensitivity retaining ratio=(1/Sensitivity after deterioration)÷(1/Initial sensitivity)

| Prescription 5 | |
|---|---|
| Cresol novolak resin (PR51767; Mw = 4,800, available from Sumitomo Durez Co.) 20% methanol solution | 50 parts |
| Exemplary compound (X-8) 2.5% methanol solution | 40 parts |
| Exemplary compound (I-4) 5% methanol solution | 10 parts |

| Prescription 6 | |
|---|---|
| 8% Aqueous potassium silicate solution | 1000 parts |
| Potassium hydroxide | 35 parts |
| Glycerin | 30 parts |

The results are shown in Table 5.

TABLE 5

| Initial sensitivity | Sensitivity after deterioration | Sensitivity retaining ratio |
|---|---|---|
| 600 mJ/cm$^2$ | 700 mJ/cm$^2$ | 0.86 |

The thus obtained lithographic printing plate was mounted on an offset printing press (3200MCD, trade name, manufactured by Ryobi K.K.) and printing was carried out up to 150,000 sheets. As a result, printed materials excellent in printing quality without any stain at non-image portion were obtained.

Example 10

A photosensitive solution prepared by the following prescription 7 was coated on an aluminum plate by a wire bar, and dried at 90° C. for 20 minutes to obtain a near infrared photosensitive composition plate having a coated amount after drying of 1.3 g/m$^2$. This plate was attached to a rotary drum, and scanning exposure was carried out by stopping down a semiconductor laser (output power: 500 mW) at 830 nm to 20 $\mu$m by a lens. The photosensitive composition plate after exposure was developed by using a developer MX1710 (trade name, available from Eastman Kodak AG, for a thermal printing plate) at 25° C. for 30seconds. A sensitivity was measured as an energy value from a drum rotation rate at which the resulting image provided 20 $\mu$m width, and the value was made an initial sensitivity. On the other hand, a sample prepared by the same prescription was allowed to stand in an oven at a temperature of 60° C. for 6 days whereby the sample was acceleratedly deteriorated. Then, an energy value was obtained in the same manner as mentioned above and the value was made a sensitivity after deterioration. Next, a sensitivity retaining ratio was obtained according to the following formula:

Sensitivity retaining ratio=(1/Sensitivity after deterioration)÷(1/Initial sensitivity)

| Prescription 7 | |
|---|---|
| m-Cresol novolak resin (BRM565; Mw = 2,500 to 3,500, available from Showa Kobunshi Co.) 20% methanol solution | 50 parts |
| Exemplary compound (X-9) 10% methanol solid dispersion | 40 parts |
| Exemplary compound (II-2) 2.5% 2-methoxyethanol solution | 20 parts |

The results are shown in Table 6.

TABLE 6

| Initial sensitivity | Sensitivity after deterioration | Sensitivity retaining ratio |
|---|---|---|
| 550 mJ/cm$^2$ | 625 mJ/cm$^2$ | 0.88 |

The thus obtained lithographic printing plate was mounted on an offset printing press (3200MCD, trade name, manufactured by Ryobi K.K.) and printing was carried out up to 150,000 sheets. As a result, printed materials excellent in printing quality without any stain at non-image portion were obtained.

Examples 11 to 16

According to the prescription 7 in Example 10, near infrared photosensitive composition was prepared by changing exemplary compounds variously. The same experiments were carried out as in Example 10 and the results are shown in Table 7. Also, the thus obtained lithographic printing plates were each mounted on an offset printing press (3200MCD, trade name, manufactured by Ryobi K.K.) and printing was carried out up to 150,000 sheets. As a result, printed materials excellent in printing quality without any stain at non-image portion were obtained.

TABLE 7

| | Compound (II), (III) or (IV) | Compound (X) | Initial sensitivity mJ/cm$^2$ | Sensitivity after deterioration mJ/cm$^2$ | Sensitivity retaining ratio |
|---|---|---|---|---|---|
| Example 11 | (II-3) | (X-4) | 800 | 950 | 0.84 |
| Example 12 | (II-4) | (X-7) | 700 | 850 | 0.82 |
| Example 13 | (II-6) | (X-1) | 1000 | 1220 | 0.82 |
| Example 14 | (II-9) | (X-11) | 750 | 870 | 0.86 |
| Example 15 | (III-1) | (X-15) | 660 | 930 | 0.71 |
| Example 16 | (IV-1) | (X-9) | 850 | 1100 | 0.77 |

Example 17

A subcoating solution prepared by the following prescription 8 was coated on an aluminum plate for a printing plate by using a wire bar, and dried at 80° C. for 30 seconds. The coated amount thereof was 10 $mg/m^2$. Next, a photosensitive solution prepared by the following prescription 9 was coated on the subbing layer by a wire bar, and dried at 90° C. for 20 minutes to obtain a near infrared photosensitive composition plate having a coated amount after drying of 1.7 $g/m^2$. This plate was attached to a rotary drum, and scanning exposure was carried out by stopping down a semiconductor laser (output power: 500 mW) at 830 nm to 20 $\mu$m by a lens. The photosensitive composition plate after exposure was developed by using a 10% aqueous sodium metasilicate solution at 25° C. for 30 seconds. A sensitivity was measured as an energy value from a drum rotation rate at which the resulting image provided 20 $\mu$m width, and the value was made an initial sensitivity. On the other hand, a sample prepared by the same prescription was allowed to stand in an oven at a temperature of 60° C. for 6 days whereby the sample was acceleratedly deteriorated. Then, an energy value was obtained in the same manner as mentioned above and the value was made a sensitivity after deterioration. Next, a sensitivity retaining ratio was obtained according to the following formula:

Sensitivity retaining ratio=(1/Sensitivity after deterioration)÷(1/Initial sensitivity)

| Prescription 8 | |
|---|---|
| β-Alanine | 0.1 part |
| Phenylphosphonic acid | 0.05 part |
| Methanol | 40 parts |
| Water | 60 parts |

| Prescription 9 | |
|---|---|
| Cresol novolak resin (PR51767; Mw = 4,800, available from Sumitomo Durez Co.) 20% methanol solution | 50 parts |
| Exemplary compound (X-8) 10% methanol solid dispersion | 10 parts |
| Exemplary compound (II-3) 5% methanol solution | 5 parts |

The results are shown in Table 8.

TABLE 8

| Initial sensitivity | Sensitivity after deterioration | Sensitivity retaining ratio |
|---|---|---|
| 650 $mJ/cm^2$ | 750 $mJ/cm^2$ | 0.87 |

The thus obtained lithographic printing plate was mounted on an offset printing press (3200MCD, trade name, manufactured by Ryobi K.K.) and printing was carried out up to 150,000 sheets. As a result, printed materials excellent in printing quality without any stain at non-image portion were obtained.

Comparative example 2

A photosensitive solution prepared by the following prescription 10 was coated on the subbing layer by a wire bar, and dried at 90° C. for 20 minutes to obtain a near infrared photosensitive composition plate having a coated amount after drying of 1.3 $g/m^2$. This plate was attached to a rotary drum, and scanning exposure was carried out by stopping down a semiconductor laser (output power: 500 mW) at 830 nm to 20 um by a lens. The printing plate after exposure was developed by using a developer MX1710 (trade name, available from Eastman Kodak AG, for a thermal printing plate) at 25° C. for 30 seconds. A sensitivity was measured as an energy value from a drum rotation rate at which the resulting image provided 20 $\mu$m width, and the value was made an initial sensitivity. On the other hand, a sample prepared by the same prescription was allowed to stand in an oven at a temperature of 60° C. for 6 days whereby the sample was acceleratedly deteriorated. Then, an energy value was obtained in the same manner as mentioned above and the value was made a sensitivity after deterioration. The results are shown in Table 9. As can be seen from the results shown in the table, it can be found that the initial sensitivity is low and deterioration in sensitivity by accelerated deterioration is remarkable.

| Prescription 10 | |
|---|---|
| m-Cresol novolak resin (BRM565; Mw = 2,500 to 3,500, available from Showa Kobunshi Co.) 20% methanol solution | 50 parts |
| Exemplary compound (X-9) 10% methanol solid dispersion | 40 parts |
| Comparative compound K 2.5% 2-methoxyethanol solution | 20 parts |

Comparative compound K

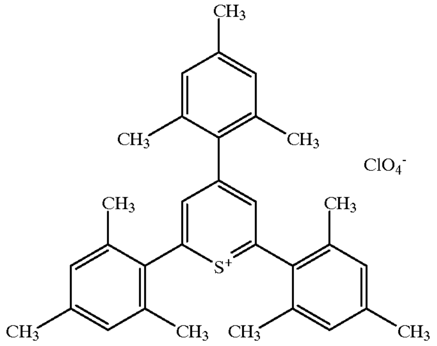

TABLE 9

| Initial sensitivity | Sensitivity after deterioration | Sensitivity retaining ratio |
|---|---|---|
| 3300 $mJ/cm^2$ | 3300 $mJ/cm^2$ | 0.51 |

Example 18

A photosensitive solution prepared by the following prescription 11 was coated on an aluminum plate by a wire bar, and dried at 40° C. for 20 minutes to obtain a near infrared photosensitive composition plate having a coated amount after drying of 1.3 $gm^2$. This plate was attached to a rotary drum, and scanning exposure was carried out by stopping down a semiconductor laser (output power: 500 mW) at 830 nm to 20 $\mu$m by a lens. The photosensitive composition plate after exposure was developed by using a developer MX1710 (tradename, available from Eastman Kodak AG, for a thermal printing plate) at 25° C. for 30seconds. A sensitivity was measured as an energy value from a drum rotation rate at which the resulting image provided 20 μm width, and the value was made an initial sensitivity. On the other hand, a sample prepared by the same prescription was allowed to stand in an oven at a temperature of 60° C. for 6 days whereby the sample was acceleratedly deteriorated. Then, an energy value was obtained in the same manner as mentioned above and the value was made a sensitivity after deterioration. Next, a sensitivity retaining ratio was obtained according to the following formula:

Sensitivity retaining ratio=(1/Sensitivity after deterioration)÷(1/Initial sensitivity)

| Prescription 11 | |
|---|---|
| m-Cresol novolak resin (BRM565; Mw = 2,500 to 3,500, available from Showa Kobunshi Co.) 20% methanol solution | 50 parts |
| Exemplary compound (X-8) 5% methanol solid dispersion | 40 parts |
| Exemplary compound (V-2) 5% methanol solution | 10 parts |

The results are shown in Table 10.

TABLE 10

| Initial sensitivity | Sensitivity after deterioration | Sensitivity retaining ratio |
|---|---|---|
| 500 $mJ/cm^2$ | 620 $mJ/cm^2$ | 0.81 |

The thus obtained lithographic printing plate was mounted on an offset printing press (3200MCD, trade name, manufactured by Ryobi K.K.) and printing was carried out up to 150,000 sheets. As a result, printed materials excellent in printing quality without any stain at non-image portion were obtained.

Examples 19 to 27

According to the prescription 11 in Example 18, near infrared photosensitive composition was prepared by changing exemplary compounds variously. The same experiments were carried out as in Example 18 and the results are shown in Table 11. Also, the thus obtained lithographic printing plates were each mounted on an offset printing press (3200MCD, trade name, manufactured by Ryobi K.K.) and printing was carried out up to 150,000 sheets. As a result, printed materials excellent in printing quality without any stain at non-image portion were obtained.

TABLE 11

| | Compound (V), (VI), (VII), (VIII) or (IX) | Compound (X) | Initial sensitivity $mJ/cm^2$ | Sensitivity after deterioration $mJ/cm^2$ | Sensitivity retaining ratio |
|---|---|---|---|---|---|
| Example 19 | (V-6) | (X-1) | 650 | 750 | 0.87 |
| Example 20 | (V-11) | (X-8) | 620 | 750 | 0.83 |
| Example 21 | (V-15) | (X-8) | 580 | 720 | 0.81 |
| Example 22 | (VI-4) | (X-11) | 550 | 680 | 0.81 |
| Example 23 | (VI-10) | (X-9) | 570 | 750 | 0.76 |
| Example 24 | (VII-10) | (X-9) | 550 | 700 | 0.79 |
| Example 25 | (VIII-3) | (X-8) | 610 | 790 | 0.77 |
| Example 26 | (VIII-5) | (X-10) | 580 | 750 | 0.77 |
| Example 27 | (IX-1) | (X-14) | 500 | 640 | 0.78 |

Example 28

A subcoating solution prepared by the following prescription 12 was coated on an aluminum plate for a printing plate by using a wire bar, and dried at 80° C. for 30 seconds. The coated amount thereof was 10 $mg/m^2$. Next, a photosensitive solution prepared by the following prescription 13 was coated on the subbing layer by a wire bar, and dried at 90° C. for 20 minutes to obtain a near infrared photosensitive composition plate having a coated amount after drying of 1.7 $g/m^2$. This plate was attached to a rotary drum, and scanning exposure was carried out by stopping down a semiconductor laser (output power: 500 mW) at 830 nm to 20 μm by a lens. The photosensitive composition plate after exposure was developed by using a 10% aqueous sodium metasilicate solution at 25° C. for 30 seconds. A sensitivity was measured as an energy value from a drum rotation rate at which the resulting image provided 20 μm width, and the value was made an initial sensitivity. On the other hand, a sample prepared by the same prescription was allowed to stand in an oven at a temperature of 60° C. for 6 days whereby the sample was acceleratedly deteriorated. Then, an energy value was obtained in the same manner as mentioned above and the value was made a sensitivity after deterioration. Next, a sensitivity retaining ratio was obtained according to the following formula:

Sensitivity retaining ratio=(1/Sensitivity after deterioration)÷(1/Initial sensitivity)

| Prescription 12 | |
|---|---|
| β-Alanine | 0.1 part |
| Phenylphosphonic acid | 0.05 part |
| Methanol | 40 parts |
| Water | 60 parts |

| Prescription 13 | |
|---|---|
| Cresol novolak resin (PR51767; Mw = 4,800, available from Sumitomo Durez Co.) 20% methanol solution | 50 parts |
| Exemplary compound (X-8) 10% methanol solid dispersion | 20 parts |
| Exemplary compound (V-14) 5% methanol solution | 5 parts |

The results are shown in Table 12.

TABLE 12

| Initial sensitivity | Sensitivity after deterioration | Sensitivity retaining ratio |
|---|---|---|
| 550 $mJ/cm^2$ | 660 $mJ/cm^2$ | 0.83 |

The thus obtained lithographic printing plate was mounted on an offset printing press (3200MCD, trade name, manufactured by Ryobi K.K.) and printing was carried out up to 150,000 sheets. As a result, printed materials excellent in printing quality without any stain at non-image portion were obtained.

Example 29

A coating solution prepared by the following prescription 14 was coated on an aluminum plate by a wire bar, and dried at 90OC for 20 minutes to form an adjacent layer containing a near infrared rays absorbing dye having a coated amount after drying of 0.8 $g/m^2$. Also, a coating solution prepared by the following prescription 15 was coated thereon by a wire bar, and dried at 90° C. for 20 minutes to laminate a recording layer having a coated amount after drying of 1.3 $g/m^2$. The thus prepared plate was attached to a rotary drum, and scanning exposure was carried out by stopping down a semiconductor laser (output power: 500 mW) at 830 nm to 20 um by a lens. The photosensitive composition plate after exposure was developed by using a 10% aqueous sodium metasilicate solution at 25° C. for 30 seconds. A sensitivity was measured as an energy value from a drum rotation rate at which the resulting image provided 20 $\mu$m width, and the value was made an initial sensitivity. On the other hand, a sample prepared by the same prescription was allowed to stand in an oven at a temperature of 60° C. for 6 days whereby the sample was acceleratedly deteriorated. Then, an energy value was obtained in the same manner as mentioned above and the value was made a sensitivity after deterioration. Next, a sensitivity retaining ratio was obtained according to the following formula:

Sensitivity retaining ratio=(1/Sensitivity after deterioration)÷(1/Initial sensitivity)

| Prescription 14 | |
|---|---|
| m-Cresol novolak resin (BRM565; Mw = 2,500 to 3,500, available from Showa Kobunshi Co.) 20% methanol solution | 50 parts |
| Excolor IR-1 (available from Nihon Shokubai K.K.) 5% methanol solution | 40 parts |

| Prescription 15 | |
|---|---|
| m-Cresol novolak resin (BRM565; Mw = 2,500 to 3,500, available from Showa Kobunshi Co.) 20% methanol solution | 50 parts |
| Exemplary compound (X-9) 10% methanol solid dispersion | 20 parts |
| Exemplary compound (I-4) 5% methyl ethyl ketone solution | 10 parts |

The results are shown in Table 13.

TABLE 13

| Initial sensitivity | Sensitivity after deterioration | Sensitivity retaining ratio |
|---|---|---|
| 300 $mJ/cm^2$ | 380 $mJ/cm^2$ | 0.79 |

The thus obtained lithographic printing plate was mounted on an offset printing press (3200MCD, trade name, manufactured by Ryobi K.K.) and printing was carried out up to 150,000 sheets. As a result, printed materials excellent in printing quality without any stain at non-image portion were obtained.

Examples 30 to 33

According to the prescription 14 in Example 29, an adjacent layer was provided with a coated amount after drying of 0.8 $g/m^2$, and further, according to the prescription 15, a recording layer was laminated thereon by changing exemplary compounds of Compound (I) and Compound (X) variously with a coated amount after drying of 1.3 g/m . The same experiments were carried out as in Example 29 by using the thus prepared near infrared photosensitive composition plates. The results are shown in Table 14. Also, the thus obtained lithographic printing plates were each mounted on an offset printing press (3200MCD, trade name, manufactured by Ryobi K.K.) and printing was carried out up to 150,000 sheets. As a result, printed materials excellent in printing quality without any stain at non-image portion were obtained.

TABLE 14

| | Compound (I) | Compound (X) | Initial sensitivity $mJ/cm^2$ | Sensitivity after deterioration $mJ/cm^2$ | Sensitivity retaining ratio |
|---|---|---|---|---|---|
| Example 30 | (I-3) | (X-1) | 350 | 400 | 0.88 |
| Example 31 | (I-11) | (X-8) | 320 | 380 | 0.84 |
| Example 32 | (I-16) | (X-8) | 330 | 400 | 0.83 |
| Example 33 | (I-14) | (X-11) | 280 | 350 | 0.80 |

Example 34

A subcoating solution prepared by the following prescription 16 was coated on an aluminum plate by using a wire bar, and dried at 80° C. for 30 seconds. The coated amount thereof was 10 $mg/m^2$. Also, a coating solution prepared by the following prescription 17 was coated thereon by a wire bar, and dried at 90° C. for 20 minutes to laminate a recording layer having a coated amount after drying of 1.4 $g/m^2$. The thus prepared near infrared photosensitive composition plate was attached to a rotary drum, and scanning exposure was carried out by stopping down a semiconductor laser (output power: 500 mW) at 830 nm to 20 $\mu$m by a lens. The photosensitive composition plate after exposure was developed by us ing a 10% aqueous sodium metasilicate solution at 25° C. for 30 seconds. A sensitivity was measured as an energy value from a drum rotation rate at which the resulting image provided 20 $\mu$m width, and the value was made an initial sensitivity. On the other hand, a sample prepared by the same prescription was allowed to stand in an oven at a temperature of 60° C. for 6 days whereby the sample was acceleratedly deteriorated. Then, an energy value was obtained in the same manner as mentioned above and the value was made a sensitivity after deterioration. Next, a sensitivity retaining ratio was obtained according to the following formula:

Sensitivity retaining ratio=(1/Sensitivity after deterioration)÷(1/Initial sensitivity)

| Prescription 16 | |
|---|---|
| β-Alanine | 0.1 part |
| Phenylphosphonic acid | 0.05 part |
| Methanol | 40 parts |
| Water | 60 parts |

| Prescription 17 | |
|---|---|
| Cresol novolak resin (PR51767; Mw = 4,800, available from Sumitomo Durez Co.) 20% methanol solution | 50 parts |
| Exemplary compound (I-4) 5% methyl ethyl ketone solution | 10 parts |
| Exemplary compound (X-9) 5% methyl ethyl ketone solution | 20 parts |
| Excolor IR-3 (available from Nihon Shokubai K.K.) 5% methanol solution | 40 parts |

The results are shown in Table 15.

TABLE 15

| Initial sensitivity | Sensitivity after deterioration | Sensitivity retaining ratio |
|---|---|---|
| 250 $mJ/cm^2$ | 300 $mJ/cm^2$ | 0.83 |

The thus obtained lithographic printing plate was mounted on an offset printing press (3200MCD, trade name, manufactured by Ryobi K.K.) and printing was carried out up to 150,000 sheets. As a result, printed materials excellent in printing quality without any stain at non-image portion were obtained.

Example 35

In the same manner as in Example 34 except for changing the near infrared rays absorbing dye; Excolor IR-3 in the prescription 17 with a diimmonium dye: IRG023 (trade name, available from Nihon Kayaku K.K.), a near infrared photosensitive composition was prepared and the same evaluation as in Example 34 was carried out. The results are shown in Table 16.

TABLE 16

| Initial sensitivity | Sensitivity after deterioration | Sensitivity retaining ratio |
|---|---|---|
| 310 $mJ/cm^2$ | 390 $mJ/cm^2$ | 0.79 |

The thus obtained lithographic printing plate was mounted on an offset printing press (3200MCD, trade name, manufactured by Ryobi K.K.) and printing was carried out up to 150,000sheets. As a result, printed materials excellent in printing quality without any stain at non-image portion were obtained.

Example 36

A photosensitive solution prepared by the following prescription 18 was coated on an aluminum plate by a wire bar, and dried at 90° C. for 10 minutes to obtain a near infrared photosensitive composition plate having a coated amount after drying of 1.3 $g/m^2$. This plate was attached to a rotary drum, and scanning exposure was carried out by stopping down a semiconductor laser (output power: 500 mW) at 830 nm to 20 um by a lens. An exposure energy is an energy calculated from a drum rotation rate which provides an exposure image line after developing treatment of 20 $\mu$m width. Contact angles to distilled water at the exposed portion and unexposed portion of the photosensitive composition plate after exposure were measured by using a contact angle measuring apparatus CA-DT-A type (trade name, manufactured by Kyowa Kaimen Kagaku K.K.). The measurement temperature was 20° C. and the measurement was carried out at 10 points in one sample surface, and the average value thereof was used as a measured value. The photosensitive composition plate was then developed by using a developer according to the following prescription 19 at 30° C. for 30 seconds. After developing treatment, contact angles to distilled water at the exposed portion by laser and unexposed portion of the photosensitive composition plate were measured and a dissolved state of the recording layer in the developer was also confirmed. The measurement temperature was 20° C. and the measurement was carried out at 10 points in one sample surface, and the average value thereof was used as a measured value. The results are shown in Table 17. As can be clearly seen from Table 17, due to a slight difference between the exposed portion to laser and unexposed portion of the photosensitive composition plate, a great difference in solubility of the recording layer in the alkaline developer was observed, and as a result, it can be found that the recording layer at the exposed portion is completely dissolved and removed whereby the surface of an anodized aluminum plate is exposed.

| Prescription 18 | |
|---|---|
| Cresol novolak resin (PR51767; Mw = 4,800, available from Sumitomo Durez Co.) 20% methanol solution | 50 parts |
| Exemplary compound (I-4) 5% methyl ethyl ketone solution | 5 parts |
| Exemplary compound (X-8) 5% methanol solution | 20 parts |
| **Prescription 19** | |
| 8% Aqueous potassium silicate solution | 1000 parts |
| Potassium hydroxide | 35 parts |
| Glycerin | 30 parts |

TABLE 17

| Exposure | Contact angle of photosensitive composition (before development) | | Contact angle of photosensitive composition (after development) | |
|---|---|---|---|---|
| energy $mJ/cm^2$ | Exposed portion | Unexposed portion | Exposed portion | Unexposed portion |
| 600 | 75° | 80° | 8° | 77° |

The thus obtained lithographic printing plate was mounted on an offset printing press (3200MCD, trade name, manufactured by Ryobi K.K.) and printing was carried out up to 150,000 sheets. As a result, printed materials excellent in printing quality without any stain at non-image portion were obtained.

Examples 37 to 46

According to the prescription 18 in Example 36, near infrared rays photosensitive compositions were prepared by changing the exemplary compounds variously. The same experiments as in Example 36 were carried out and the results are shown in Table 18.

TABLE 18

| | | | Exposure | Contact angle of photosensitive composition: Before development | | After development | |
|---|---|---|---|---|---|---|---|
| | Compound (I) to (IX) | Compound (X) | energy $mJ/cm^2$ | Exposed portion | Unexposed portion | Exposed portion | Unexposed portion |
| Example 37 | (I-4) | (X-9) | 550 | 70° | 78° | 6° | 77° |
| Example 38 | (I-16) | (X-8) | 650 | 73° | 78° | 7° | 76° |
| Example 39 | (II-3) | (X-7) | 600 | 75° | 79° | 10° | 77° |
| Example 40 | (II-6) | (X-15) | 600 | 72° | 77° | 9° | 75° |
| Example 41 | (IV-1) | (X-8) | 700 | 75° | 79° | 9° | 78° |
| Example 42 | (V-2) | (X-14) | 750 | 75° | 80° | 7° | 80° |
| Example 43 | (V-11) | (X-1) | 800 | 71° | 76° | 8° | 75° |
| Example 44 | (VI-4) | (X-8) | 800 | 72° | 81° | 6° | 80° |
| Example 45 | (VII-3) | (X-8) | 650 | 70° | 75° | 8° | 72° |
| Example 46 | (VIII-1) | (X-9) | 600 | 75° | 78° | 11° | 75° |

The thus obtained lithographic printing plates were each mounted on an offset printing press (3200MCD, trade name, manufactured by Ryobi K.K.) and printing was carried out up to 150,000 sheets. As a result, printed materials excellent in printing quality without any stain at non-image portion were obtained.

Comparative example 3

According to the prescription 18 of Example 18, near infrared rays photosensitive compositions were prepared by changing the exemplary compounds variously. The same experiments as in Example 36 were carried out and the results are shown in Table 19. As can be clearly seen from Table 19, when a comparative compound is used, there is no difference in contact angles between the exposed portion and the unexposed portion after exposure to laser beam and the contact angle at the exposed portion by a laser beam after development is large so that it can be understood that the resin of the recording layer at the exposed portion cannot completely be dissolved or removed.

Comparative compound L

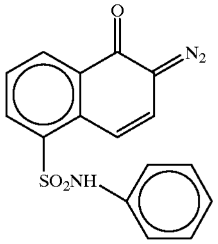

TABLE 19

| | Comparative Compound | Compound (X) | Exposure energy mJ/cm$^2$ | Contact angle of photosensitive composition: Before development: Exposed portion | Before development: Unexposed portion | After development: Exposed portion | After development: Unexposed portion |
|---|---|---|---|---|---|---|---|
| Comparative example 3 | L | (X-8) | 650 | 78° | 78° | 45° | 77° |

The thus obtained lithographic printing plate was mounted on an offset printing press (3200MCD, trade name, manufactured by Ryobi K.K.) and printing was carried out. As a result, background fogging was generated at the non-image portion (corresponding to the exposed portion by laser) and no good printed materials can be obtained.

As can be seen from the results of Examples 36 to 46 and Comparative example 3, by using photosensitive compositions which have a contact angle of 70° or more and cause lower in the contact angle to 10° or less by exposure to near infrared laser, good image formation can be carried out.

Example 47

A photosensitive solution prepared by the following prescription 20 was coated on an aluminum plate by a wire bar, and dried at 90° C. for 20 minutes to obtain a near infrared photosensitive composition plate having a coated amount after drying of 1.3 g/m$^2$. As the near infrared rays absorbing dye, among the compounds shown below, the compound of the formula M-1 was used. This plate was attached to a rotary drum, and scanning exposure was carried out by stopping down a semiconductor laser (output power: 500 mW) at 830 nm to 20 pm by a lens. The photosensitive composition plate after exposure was developed by using a 6% aqueous sodium metasilicate solution as a developer at 25° C. for 30 seconds. A sensitivity was measured as an energy value from a drum rotation rate at which the resulting image provided 20 $\mu$m width, and the value was made an initial sensitivity. On the other hand, a sample prepared by the same prescription was allowed to stand in an oven at a temperature of 60° C. for 6 days whereby the sample was acceleratedly deteriorated. Then, an energy value was obtained in the same manner as mentioned above and the value was made a sensitivity after deterioration. Next, a sensitivity retaining ratio was obtained according to the following formula:

Sensitivity retaining ratio=(1/Sensitivity after deterioration)÷(1/Initial sensitivity)

| Prescription 20 | |
|---|---|
| m-Cresol novolak resin (BRM565; Mw = 2,500 to 3,500, available from Showa Kobunshi Co.) 20% methanol solution | 50 parts |
| Near infrared rays absorbing dye; M-1 10% methanol solid dispersion | 10 parts |
| Exemplary compound (I-9) 5% methyl ethyl ketone solution | 10 parts |

M-1

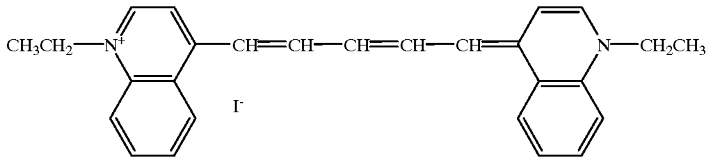

M-2

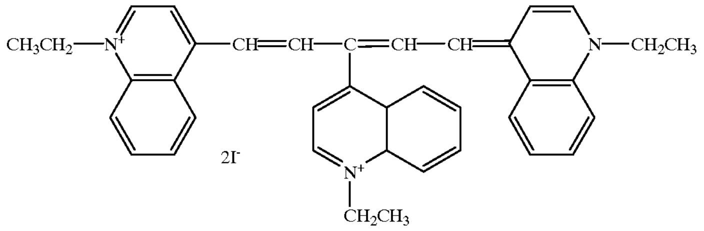

M-3

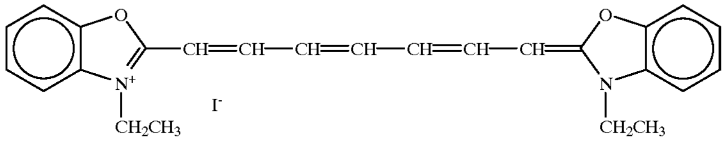

-continued

M-4

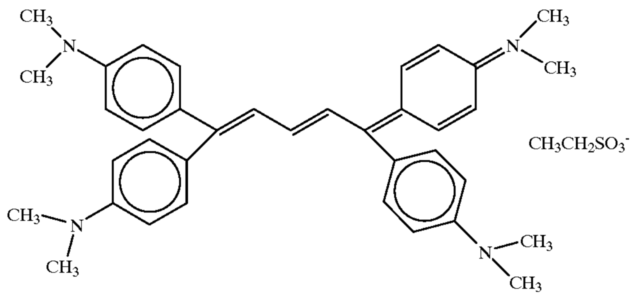

M-5

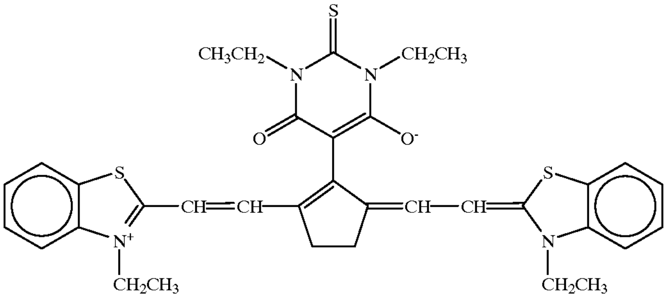

M-6

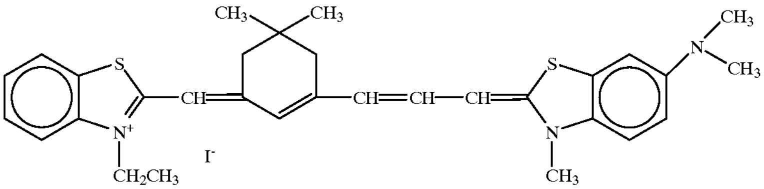

M-7

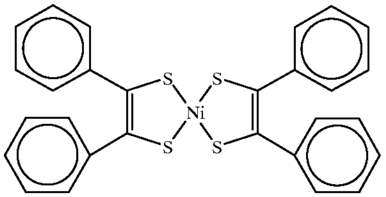

M-8

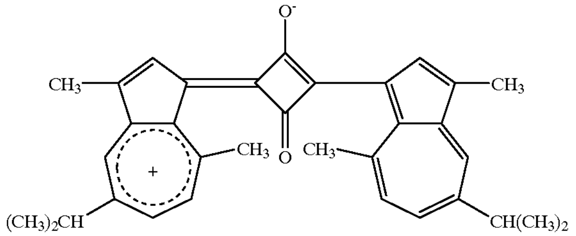

The results are shown in Table 20.

TABLE 20

| Initial sensitivity | Sensitivity after deterioration | Sensitivity retaining ratio |
|---|---|---|
| 700 mJ/cm$^2$ | 1300 mJ/cm$^2$ | 0.54 |

The thus obtained lithographic printing plate was mounted on an offset printing press (3200MCD, trade name, manufactured by Ryobi K. K.) and printing was carried out up to 150,000 sheets. As a result, printed materials excellent in printing quality without any stain at non-image portion were obtained.

Examples 48 to 54

According to the prescription 20 in Example 47, near infrared rays photosensitive compositions were prepared by changing the near infrared rays absorption dyes variously. The same experiments as in Example 47 were carried out and the results are shown in Table 21.

TABLE 21

| | Compound (I) to (IX) | Near infrared rays absorption dye | Initial sensitivity mJ/cm$^2$ | Sensitivity after deterioration mJ/cm$^2$ | Sensitivity retaining ratio |
|---|---|---|---|---|---|
| Example 48 | (I-16) | M-2 | 750 | 1100 | 0.68 |
| Example 49 | (II-3) | M-3 | 820 | 1250 | 0.66 |
| Example 50 | (V-4) | M-4 | 700 | 1400 | 0.50 |
| Example 51 | (VI-1) | M-5 | 850 | 1300 | 0.65 |
| Example 52 | (VII-7) | M-6 | 800 | 1300 | 0.62 |
| Example 53 | (VIII-3) | M-7 | 730 | 1200 | 0.61 |
| Example 54 | (IX-2) | M-8 | 750 | 1350 | 0.56 |

The thus obtained lithographic printing plate was mounted on an offset printing press (3200MCD, trade name, manufactured by Ryobi K. K.) and printing was carried out up to 150,000 sheets. As a result, printed materials excellent in printing quality without any stain at non-image portion were obtained.

According to the present invention, by using a photosensitive composition which comprises a recording layer containing at least one compound selected from a hdihydropyridine compound, a pyrylium compound, a carbamate compound, a triarylcarbinol compound and a pinacol compound; a polymer which is soluble in an alkaline developer; and a near infrared rays-absorbing dye, and a contact angle of said recording layer is lowered by irradiating with a near infrared rays laser, a plate material of a positive type photosensitive composition having high sensitivity to near infrared rays and excellent in preservability can be obtained.

What we claimed is:

1. A positive type photosensitive composition which comprises a support, and a recording layer provided thereon containing a polymer soluble in an alkaline developer, a compound represented by the formula (I):

(I)

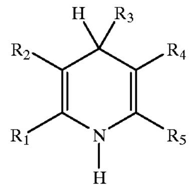

wherein $R_1$ and $R_5$ may be the same or different from each other and each represent an alkyl group; $R_2$ and $R_4$ may be the same or different from each other and each represent —COOR' group, —COR' group or —CN group where R' represents an alkyl group, an aralkyl group or an aryl group; and $R_3$ represents an alkyl group, an alkenyl group, an aralkyl group, an aralkenyl group, an aryl group or an aromatic heterocyclic residue, and a near infrared rays-absorbing dye, wherein, by irradiating near infrared rays to said recording layer, a solubility in the developer at a portion to which near infrared rays are irradiated is increased than a solubility in the developer at a portion to which no near infrared rays is irradiated, and wherein said near infrared rays-absorbing dye is a cyanine dye represented by the formula (X):

(X)

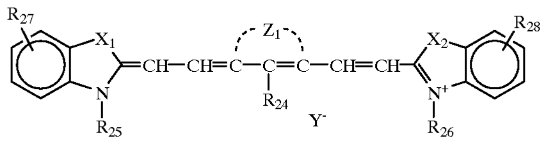

wherein $R_{24}$ represents a hydrogen atom, a halogen atom, an alkyl group or a diphenylamino group; $R_{25}$ and $R_{26}$ may be the same or different from each other and each represent an alkyl group, an alkoxyalkyl group, an acyloxyalkyl group or a sulfoalkyl group; $R_{27}$ and $R_{28}$ may be the same or different from each other end each represent a hydrogen atom, a halogen atom, an alkoxy group or a phenyl group, and when $R_{27}$ or $R_{28}$ represents a phenyl group, it may be fused with the phenyl group of the dye skeleton to form a naphthalene ring; $Z_1$ is a substituent on carbon atoms of the dye skeleton, and represents a divalent hydrocarbon group forming a cyclohexene ring or a cyclopentene ring with the carbon atoms of the dye skeleton, or independent two substituents selected from a hydrogen atom and an alkyl group; $X_1$ and $X_2$ may be the same or different from each other and each represent a sulfur atom, a methylene group which may have one or two substituents, or an unsubstituted vinylene group, and the substituent(s) of the methylene group is selected from an alkyl group having 1 to 6 carbon atoms or a hydrocarbon residue which forms a spiro ring having 3 to 6 carbon atoms; $Y^-$ represents a pair anion of the dye, but when $R_{25}$ and $R_{26}$ both represent sulfoalkyl groups, the dye itself becomes a neutral molecule so that it is not necessary.

2. The positive type photosensitive composition according to claim 1, wherein the polymer soluble in the alkaline developer is a novolak resin.

3. The positive type photosensitive composition according to claim 1, wherein the contact angle of the recording layer is 70° or higher and the contact angle thereof is lowered by irradiating a near infrared rays laser to said recording layer.

* * * * *